(12) United States Patent
Hilliard

(10) Patent No.: US 6,488,825 B1
(45) Date of Patent: Dec. 3, 2002

(54) OPTICALLY COUPLED SPUTTER APPARATUS

(76) Inventor: Donald Bennett Hilliard, 3050 N. Fontana, Tucson, AZ (US) 85705

( * ) Notice: Subject to any disclaimer, the term of this patent is extended or adjusted under 35 U.S.C. 154(b) by 0 days.

(21) Appl. No.: 09/839,349

(22) Filed: Apr. 20, 2001

Related U.S. Application Data

(62) Division of application No. 09/394,554, filed on Sep. 10, 1999, now Pat. No. 6,265,033.
(60) Provisional application No. 60/099,964, filed on Sep. 11, 1998.

(51) Int. Cl.[7] .............................................. C23C 14/34
(52) U.S. Cl. ............................ 204/298.06; 204/298.04; 204/298.08
(58) Field of Search ..................... 204/298.04, 298.06, 204/298.08

(56) References Cited

U.S. PATENT DOCUMENTS

| | | | |
|---|---|---|---|
| 3,654,109 A | 4/1972 | Hohl et al. ................ 204/192 |
| 4,615,034 A | 9/1986 | von Gunten et al. ......... 372/99 |
| 4,664,769 A | 5/1987 | Cuomo .................... 204/192.1 |
| 4,779,286 A | 10/1988 | Wheatley et al. ............ 372/93 |
| 4,798,952 A | 1/1989 | Fink et al. .................. 200/251 |
| 4,799,454 A | 1/1989 | Ito .............................. 118/723 |
| 4,842,686 A | 6/1989 | Davis et al. ................ 438/709 |
| 4,911,809 A | * 3/1990 | Wort et al. ............ 204/192.11 |
| 5,062,116 A | 10/1991 | Christensen et al. .......... 372/61 |
| 5,096,739 A | 3/1992 | Strutt ........................ 427/53.1 |
| 5,205,870 A | 4/1993 | Sato et al. .................. 118/722 |
| 5,415,901 A | 5/1995 | Tanaka et al. ............... 427/596 |
| 5,433,791 A | 7/1995 | Brewer et al. ............... 118/724 |
| 5,441,569 A | 8/1995 | Veligdon et al. ....... 118/723 MP |
| 5,472,506 A | * 12/1995 | Tohma et al. ................ 118/718 |
| 5,672,210 A | 9/1997 | Moto et al. .................. 118/726 |
| 5,691,280 A | 11/1997 | Eckstein et al. ............. 505/329 |
| 5,733,609 A | 3/1998 | Wang .......................... 427/561 |

OTHER PUBLICATIONS

Victor F. Tarasenko, "Coaxial, cylindrical, and planar UV excilamps, pumped by glow or barrier discharge", SPIE vol. 2992 (1997), p. 24–34.*

J. M. Gee, et al. "Plasma–initiated laser deposition of polycrystalline and monocrystalline silicon films." Materials Research Symp. Proc. (1984) p. 15–20. vol. 29, Elsevier.

* cited by examiner

Primary Examiner—Steven H. VerSteeg

(57) ABSTRACT

A sputtering system for the depositing or etching of insulating, conducting, or semiconducting thin films is disclosed, in which the sputtering plasma is irradiated with a transverse, adjustable ultraviolet emission produced by an ultraviolet optical cavity containing a lamp discharge. The cavity irradiates the sputtering plasma volume with a sufficiently high optical flux to enact significant changes in the film produced. This effect is enabled by the device geometry, which, in the preferred embodiment, provides uniquely high efficiency and stability in the optical coupling between the lamp discharge and the sputtering plasma, resulting in the ability to significantly alter ionized and excited state populations within or above the sputtering plasma. The design also allows the operator to significantly control the volume and species involved in the optical interaction. A novel ultraviolet source for materials processing is also disclosed.

16 Claims, 10 Drawing Sheets

OPTICALLY COUPLED SPUTTER APPARATUS

This is a division of Ser. No. 09/394,554, filed Sep. 10, 1999, which is now U.S. Pat. No. 6,265,033. This application claims priority from provisional appl. Ser. No. 60/099,964, filed Sep. 11, 1998.

BACKGROUND OF THE INVENTION

1. Field of the Invention

The present invention relates generally to vapor deposition methods and, in particular, a plasma sputtering apparatus by which thin or thick films of insulating, semiconductor, or conductive materials are formed. Potential applications exist in the fabrication of integrated circuits, optical elements, optoelectronic devices, and other such products requiring well-controlled physical properties in these same films. According to another aspect, the present invention relates generally to the field of ultraviolet light sources.

2. Description of the Related Art

In one aspect, the invention relates generally to the treatment of dispersed photoabsorbing media, such as gases, with ultraviolet radiation. An equipment geometry for this purpose, in fluid treatment, utilizes a flow-through geometry, wherein the media to be processed passes through a processing tube constructed of ultraviolet-transmitting material—such as fused silica—and wherein the tube is surrounded with one or several ultraviolet lamps, thereby creating a high radiative flux within the photoabsorbing media. The coupling efficiency of the ultraviolet radiation to the media may then be increased, by placing this coaxial arrangement within a reflective cavity. This latter reflective cavity becomes increasingly necessary as the extinction distance of the ultraviolet within the media becomes much greater than the relevant physical dimension of the apparatus, and the ultraviolet radiation must make many passes through the media before it is appreciably absorbed.

When the extinction distance is orders of magnitude longer than the relevant cavity dimension, the coupling efficiency of this ultraviolet source becomes inherently limited by parasitic losses within the reflective cavity, which "steal" the ultraviolet radiation away before it can be absorbed by the dispersed media. Similarly to a laser source, such losses can be largely attributed to a combination of the mirror quality, diffraction losses, and the propagation of the ultraviolet along optical paths which "walk off" the cavity mirrors in so-called "end-losses". Unlike a laser, however, retention within the reflective cavity of these lamp sources is not greatly increased through the establishment of high-retention lasing modes that dominate the photoemission process. In addition, as clearance restrictions require the aforementioned processing tube to be increasingly short in length—or of increasingly smaller aspect ratio—the end-losses of the commensurately shorter reflective cavity become a serious limitation to the coupling efficiency of the processing apparatus. Conversely, ultraviolet radiation that is allowed to leak from the reflective cavity may adversely interact with other parts of the process. These sort of requirements have been partially dealt with in past fusion research, at least when using longer optical wavelengths, by implementing a laser cavity. In this approach, the photoabsorbing media is passed through the laser cavity itself. However, this approach becomes far more difficult for other, similarly configured, materials processes that require ultraviolet radiation; in part, because these latter processes would typically require much more economical solutions than those afforded fusion research, whereas, capital and maintenance costs for a high-power ultraviolet laser are likely to be prohibitively high.

The problems encountered with irradiating low absorption cross-section dispersed media become increasingly acute with lower pressure processes, wherein the dispersed media would typically be some gas or vapor which is rarified to a degree consistent with the level of vacuum. In these latter vacuum processes, one encounters situations wherein the absorbing constituent may have a vapor pressure of only $10^{-6}$ atmospheres, with extinction distances in the range of $10^2$ to $10^3$ meters. At the same time, these vacuum processes will frequently involve one or several critical material surfaces that interact with the process quite differently when irradiated with the ultraviolet radiation. These same critical surfaces will typically be modified during the process, so that the result of irradiating these surfaces will change, as well. For instance, a thin film forming on one of these material surfaces can dramatically alter the absorption, scatter, or reflection of the ultraviolet radiation as its thickness increases. In ultraviolet-enhanced physical vapor deposition (PVD) processes, including reactive processes utilizing PVD sources, these issues have not been adequately addressed.

A prevalent PVD means in industry for the deposition of high quality thin films is through the utilization of sputtering techniques. The term "sputtering" refers to a group of mechanisms by which material is ejected from a solid, or sometimes a liquid, target surface into a vapor form; this latter effect being due, at least in part, in either physical or chemical sputtering, to the kinetic energy transferred to the target atoms or molecules by bombarding particles. These mechanisms are utilized in sputter deposition processes categorized generally as laser sputtering, ion beam sputtering, glow discharge (or diode) sputtering, and magnetron glow discharge sputtering. The present invention, in its preferred embodiment, concerns primarily plasma sputtering, and, in particular, magnetron plasma sputtering. The magnetic confinement of the sputtering plasma in the magnetron sputtering process allows for a far greater range of mean free paths than the earlier, capacitively coupled diode plasma sputtering process. Its high deposition rate, combined with its versatility in depositing a wide range of materials under a great range of conditions, has made magnetron plasma sputtering a preferred thin film deposition technique for many industrial applications.

Yet, there are several aspects of plasma sputtering which are seen as significant barriers in utilizing the technique for future industrial applications. Most commercially available plasma sputter sources provide a small proportion of ionized species to the depositing film (<5%). Most of the energy supplied for non-equilibrium growth is supplied by the thermal velocities of the depositing species. The thermal distribution of these velocities is necessarily broad, allowing little control over specific growth processes at the film growth interface. Because the energy supplied by the depositing species is kinetic, it is often difficult to provide high energies to the growth interface with out simultaneously causing subsurface damage, due to the recoil and implantation of the bombarding atoms.

Several modifications have been devised to render greater control over plasma sputtering processes wherein, as in the present invention, excited state and ion populations in the gas/vapor phase are increased and manipulated by means external to the sputtering plasma. This is most commonly accomplished by injecting electrons into the sputtering plasma to increase the plasma density and ion population, while simultaneously allowing a decrease of the target voltage. A resulting benefit is the ability to introduce a high proportion of relatively low energy ions to either etch or deposit on the substrate. This method has been made popular in the well-established triode and tetrode sputtering configurations, wherein electrons are usually supplied by a thermionic filament. This latter art has been found to work well for the deposition of metals, but is not compatible with reactive processes where electron emitting surfaces are prone to modification.

In recent years, plasma sputtering processes have also been developed that increase ionization through the utilization of secondary coils or antennas for RF or microwave excitation of the plasma. This latter prior art has also been found useful in the deposition of metals. However, difficulties arise, in that resonance conditions are effected by the inevitable modification of the process chamber surfaces during deposition, especially when depositing insulating or semi-insulating materials; also, these latter developments offer little resolution of the plasma species to be ionized.

The use of sources of UV/optical energy in conjunction with sputtering plasmas is relatively limited compared to the prior art concerning electron sources. In various instances, plasma sputtering experiments have been conducted utilizing the geometry set forth in U.S. Pat. No. 4,664,769 issued May 12, 1987 by Cuomo et al. This patent teaches a method wherein a UV source is directed onto a sputtering target during the magnetron sputtering process. The UV wavelength used is of an energy of or exceeding the photoelectric threshold of the target material, thereby causing the target to emit photoelectrons into the sputtering plasma. This photoelectric addition of electrons is found to increase plasma density, lower the cathode voltage required to sustain a discharge, as well as to increase the ion flux to the substrate, enabling modification of the film properties. As this work focuses on the irradiation of the sputtering target, its operation is contradictory to the goals of the present invention.

The use of UV/optical sources with magnetron sputtering plasmas in later work has consisted of efforts wherein a UV source, usually a laser, is directed upon the substrate being processed. These experiments are conducted in order to promote and study various surface reactions and solid phase transformations at the substrate surface, sometimes with a reactive gas injected at the substrate. As such, these accounts deal with UV interactions with the substrate surface and do not anticipate the present invention.

The use of UV/optical radiation sources in combination with processing plasmas has consisted mostly of the research conducted in relatively higher pressure photoenhanced and plasma-enhanced chemical vapor deposition (CVD) processes. In the relevant accounts, ultraviolet radiation, usually from a laser, irradiates the substrate upon which the thin film is being deposited. This work in CVD was originated by Hargis, Gee, et al, and reported in the publications, "Laser-plasma interactions for the deposition and etching of thin-film materials", wherein is described the mechanism by which laser-produced UV activates the top monolayers which are plasma-deposited on the substrate.

This initial work utilizing both plasmas and UV radiation sources in CVD has continued. Researchers have since found that the plasmas used for plasma-enhanced CVD and plasma-enhanced chemical etching may be simultaneously or separately used as a photochemical UV source. The interaction of UV with these plasma-enhanced CVD and chemical etch processes has been found to take place primarily in surface modifications, such as in photoactivation of heterogeneous surface reactions at the substrate surface; because of this, these process geometries must incorporate means for illuminating the substrate surface which is being modified. Any photo-activated gas-phase reactions which might, in addition to the surface interactions, occur in these CVD and chemical etching plasmas would be essentially non-existent in the low-pressure, higher power density sputtering plasmas; nor are such gas phase reactions a necessary element of the present invention.

While the use of UV sources is a promising route for enhancing and controlling film growth and etching processes in plasma processing, the aforementioned prior art has had little impact on sputtering deposition/etching applications. Reasons for this are viewed, in the present invention, in light of the highly non-equilibrium thermodynamic mechanisms inherent in plasma sputtering technology. While the plasma sputter source provides a reliable means for depositing many materials under a wide range of conditions, consistently achieving a specific resultant film structure and composition, within relatively tight tolerances, remains a formidable challenge. Introducing additional energy sources to the sputtering plasma further complicates issues of stability and repeatability.

The prior art invariably utilizes process-altered surfaces which receive UV energy, namely the sputtering target or the substrate; but, in addition, chamber walls and fixturing. Any solid surfaces which might potentially receive UV radiation must act as a transmitting, reflecting, absorbing, or scattering surface. Because these process surfaces tend to be altered during the deposition process, the interaction of the UV source with the deposition process is also altered. As the reflectivity, scattering, and absorption occurring at these surfaces changes with process time, plasma-related mechanisms occurring throughout the process volume, such as secondary electron emission, gas/vapor photo-excitation, radiant heating, and photon-assisted sputtering, can all be dramatically altered. Hence, UV radiation incident on a growing film, or on the sputtering target, can interact with the deposition process in an unstable fashion.

Another problem arises in the use, in previous experiments, of UV (and other) sources which interact, in particular, with magnetron plasmas in a highly asymmetric geometry. The relative stability and repeatability of a conventional magnetron plasma source is due, in great part, to the maintenance of a symmetrically uniform magnetic and electric field for containment of the magnetron plasma. For example, a rectangular magnetron is more prone to arcing, in D.C. reactive sputtering, than a circular magnetron, due to its lower symmetry. As such, any UV source which is made to interact with a magnetron plasma should preserve the magnetron's symmetry, if stable, repeatable performance is to be maintained.

The terms "plasma" and "discharge" both refer herein to the general sense of an electrically or electromagnetically sustained, photo-emitting, gas/vapor discharge, wherein quasineutrality of the gas/vapor may not necessarily exist. While the term "plasma" has been used more restrictively, and certainly more inclusively, than in the definition offered herein, the latter definition is consistent with current-day usage in the semiconductor industry, vapor deposition sciences, and other areas where the present invention might find application. The two terms are utilized differently in the present disclosure as a means of clearly differentiating between the sputtering "plasma" of the preferred embodiment, and the photoemitting "discharge" of the disclosed ultraviolet lamp source.

In disclosing the present invention, the terms "cavity", "reflective cavity", and "optical cavity", will all refer to the common and general sense of a predetermined structure for confining propagation of optical radiation between reflective surfaces. Also, the use of the term "vapor" will herein refer to any gaseous or vapor-like substance, as distinguished from a solid or liquid. This includes atoms, molecules, ions, clusters, and other such dispersed substances which may traverse the process space of a processing chamber.

SUMMARY OF THE INVENTION

The previously cited problems, as recognized by the present invention, are addressed herein, in part, through the development of a novel ultraviolet processing apparatus that provides both highly efficient coupling and well-controlled interactions with dispersed photoabsorbing media, such as vapors. According to one aspect of the present invention, a narrow-band UV source has been developed which represents a significant departure from previous incoherent or coherent light sources used in materials processing. The UV source disclosed herein utilizes an optical cavity which allows unusually high retention without requiring the establishment of optical gain. Unlike a conventional laser, light is not coupled through a partially reflective mirror to a medium external to the cavity, but instead, is coupled directly to dispersed photoabsorbing process media present in the central process space within the optical cavity. Since the process media is, in the preferred embodiment, a vapor with a necessarily low photo-absorption cross section, the "active" losses in the cavity can be very low, allowing the cavity radiation density to increase proportionally, thereby increasing total absorption. The radiation density is also increased by virtue of the large effective numerical aperture achieved, as the symmetric cavity focuses the optical energy to a relatively small process space at the center of the cavity. As a quasi-monochromatic source, the reflective cavity is designed to be capable of higher efficiency and higher average radiation density than available ultraviolet-emitting lasers. Compared to previous UV lamps, the UV source developed herein can maintain relatively high overall efficiency in the both the generation of high radiation densities, and the utilization of the generated UV photons for a selected photo-absorption process. This efficiency is enabled through a configuration that delimits the process volume, in part, through the use of thin film optical interference means.

In accordance with the illustrated preferred embodiment, the present invention also provides a sputtering apparatus and method for the deposition of material on a workpiece, using intense ultraviolet (UV) radiation, including vacuum ultraviolet (VUV; $\lambda$<200 nm) radiation, to irradiate vapor constituents of a sputtering process. In particular, the sputtering apparatus disclosed herein allows a very high degree of optical coupling, as well as a high symmetry and a high selectibility of optical coupling, between a high power, UV-producing lamp discharge and the sputtering plasma.

In its first preferred embodiment the invention includes a central circular magnetron electrode for sustaining the sputtering plasma, a peripheral optical aperture located above the electrode, a separate concentric volume containing means for generating high power, narrow-band UV emission, a concentric reflective cavity, means for positioning a workpiece to receive depositing species, and optical interference and collimation means for both spatial and spectral control of the UV emission within the sputtering plasma. The sputter source described herein utilizes the aforementioned UV processing apparatus, which confines UV radiation to propagate within a planar process space above the sputtering target ("above the target" will, throughout this text, refer to the side of the target exposed to vacuum). The energy and radiation density of the UV radiation produced by the disclosed UV apparatus is sufficient to ionize a vapor or gas constituent of the sputtering plasma.

Whereas the use of UV radiation offers the potential for highly resolved interactions with specific plasma species, prior plasma sputtering art utilizing UV has not been developed significantly as a production method. Prior art plasma sputtering experiments utilizing ultraviolet energy for altering plasma sputtering processes have invariably required direct illumination of a processing surface, namely, the target or workpiece; many of these interactions are found in the present invention to be inherently unstable and difficult to control in a sputtering environment. These latter UV-surface interactions also tend to dominate the photoabsorption process, especially at the low pressures used in sputtering processes, thereby severely limiting the proportion of the UV radiation actually absorbed through UV-vapor interactions. In the present invention, through the efficient containment of UV spectral emissions, effective collimation of the UV, and a symmetric distribution of UV about the sputtering plasma's major axis of symmetry, a high density of UV radiation is available for stable and repeatable photo-excitation and/or photo-ionization of the gas/vapor-phase plasma species; at the same time, the interactions of this UV energy with the target, workpiece, or other process-altered surfaces, are profoundly reduced. Another related advantage of the UV source of the present invention, in its capacity as a UV-assisted processing apparatus, is the possibility of reducing UV-induced damage at the workpiece being processed.

The present invention provides a new and versatile method for fabricating thin film structures by enacting a greater degree of control over both the sputtering plasma parameters, and the nature of plasma-emitted particles, than conventional plasma sputtering processes. One advantage of the present invention is that it introduces a means for increasing ion densities in a repeatable, low-cost method. The present invention, in its preferred embodiment, offers distinct advantages over the prior art as a method for producing high ion densities in or above the sputtering plasma. This increase in ion density is achieved by using well-resolved, photo-ionizing UV-plasma interactions, in a configuration which substantially reduces the interaction of ionizing radiation with any process-altered surface. A resulting advantage is the introduction of a both repeatable and highly tailorable process for increasing ion densities in and/or above the sputtering plasma.

Another advantage of the present invention is the increased control allowed in achieving specific compositional or structural characteristics in the thin (or thick) film structures formed. The selective and reproducible ionization of a specific species in, or above, the sputter plasma allows control over the kinetic and chemical energies of those specific atomic or molecular species at the growth front of the film. The ability to control ion fluxes, chemical energy, and kinetic energies in vapor depostion are powerful tools in controlling the microstructure and crystallinity of a deposited film. Because of the thermodynamic non-equilibrium nature of the sputtering process, it may produce material phases and phase combinations not possible in more thermodynamically equilibrium processes, such as evaporation or the earlier diode sputtering. This is due to the energies supplied by the depositing atoms, and their reactions, at the growth interface, being representative of temperatures far exceeding that of the bulk temperature of the workpiece.

Hence greater latitude in controlling these energies via mean free path (i.e., pressure) and ionization greatly increases the latitude available in achieving a particular film structure. At the lower sputtering pressures possible with higher ion densities, the resultant films deposited will also tend to contain less contamination by the sputtering gas (e.g., argon). This will, in turn, minimize structural defects induced by these gases, enhancing the use of sputtering as an epitaxial technique.

Higher ion fluxes in sputtering also greatly enable the effort to perform so-called metallic-mode reactive sputtering, wherein the target remains metallic during deposition and the reacted product is formed at the workpiece, as chemical activity of the metal atoms at the workpiece is greatly enhanced. This latter method is important for high-rate sputtering of dielectrics, as well as providing a promising technique in sputter epitaxy. Other objects related to the present invention follow.

An object of the present invention is to provide a means for increasing the density of ionized and excited species in or above a sputtering plasma.

A further object of the invention is to provide a means of selectively activating desired transitions in the sputtering plasma, and thereby enacting a change in the properties of the deposited film.

Another object of the invention is to provide a means of irradiating the sputtering plasma and/or adjacent vapor with a high density of UV energy, in a manner which isolates the volume and nature of UV interaction.

Another object of the invention is to provide ionizing UV energy to plasma species without producing UV-induced damage at an adjacent workpiece.

Yet another object of the present invention is to provide a means of inducing a greater degree of self-sputtering of the target material, and thereby lowering the background pressure of inert gas required to sustain the plasma.

Another object of the present invention is to provide a self-contained means of irradiating dispersed photoabsorbing media.

Another object of the invention is to provide a novel, plasma-sustained ion source for the development of sputter-assisted processes.

BRIEF DESCRIPTION OF DRAWINGS

There are a total of ten (10) figures accompanying this disclosure.

FIG. 1 is a sectional side view of a first embodiment of the present invention. The viewed cross-sectional plane contains the central axis (31) of circular symmetry, so that the viewed plane divides the device in half.

FIG. 2 is a sectional top view of the invention as constructed in FIG. 1, with the section taken along the line (16) of FIG. 1, and illustrates the circular symmetry of the device, as well as the additional representation of the optional baffle assembly (32).

FIG. 3 is a general schematic of optical propagation within the present invention according to the embodiments of FIGS. 1 and 2, and illustrates the effective focusing and filtering of a normal incidence, narrow-band UV transmission of central wavelength, $\lambda_0$, achieved by use of the circular Fabry-Perot filter and peripheral UV illumination.

FIG. 4 is a general schematic illustrating typical related equipment used in the operation of the present invention in the first preferred embodiments of FIGS. 1 and 2.

FIG. 5 is a general schematic of optical propagation for a UV wavelength, $\lambda_1$, slightly shorter than $\lambda_0$, propagating in the structure identical to FIG. 3.

FIG. 6 is an alternative embodiment of the present invention which illustrates the use of a secondary UV-discharge which does not lie in the plane of the sputtering plasma. As before, the plane of the cross section contains the central axis (31) about which the device possesses circular symmetry.

FIG. 7 is another alternative embodiment of the present invention in which the symmetric irradiation of the sputtering plasma is now provided by a UV-discharge located on the opposite side of the sputter electrode (1) from the sputtering plasma (5).

FIG. 8 is a partial side view and accompanying geometric figure illustrating the alternative use of an elliptical vertical cross section for the secondary reflector.

FIG. 9 is a combination top view and sectional side view depicting an alternative embodiment of the present invention, which illustrates the principles of the present invention incorporated in a rectangular sputtering apparatus, as well as the use of tubular excilamps as the UV-discharge.

FIG. 10 is a general schematic illustrating the use of a laser and segmented optics in the annular reflective cavity, satisfying the requirement of symmetric transverse UV irradiation of a sputtering plasma.

DESCRIPTION OF THE PREFERRED EMBODIMENTS

The following description and FIGS. 1 through 10 of the drawings depict various embodiments of the present invention. The embodiments set forth herein are provided to convey the scope of the invention to those skilled in the art. While the invention will be described in conjunction with the preferred embodiments, various alternative embodiments to the structures and methods illustrated herein may be employed without departing from the principles of the invention described herein. Like numerals are used for like and corresponding parts of the various drawings.

Figure 1:
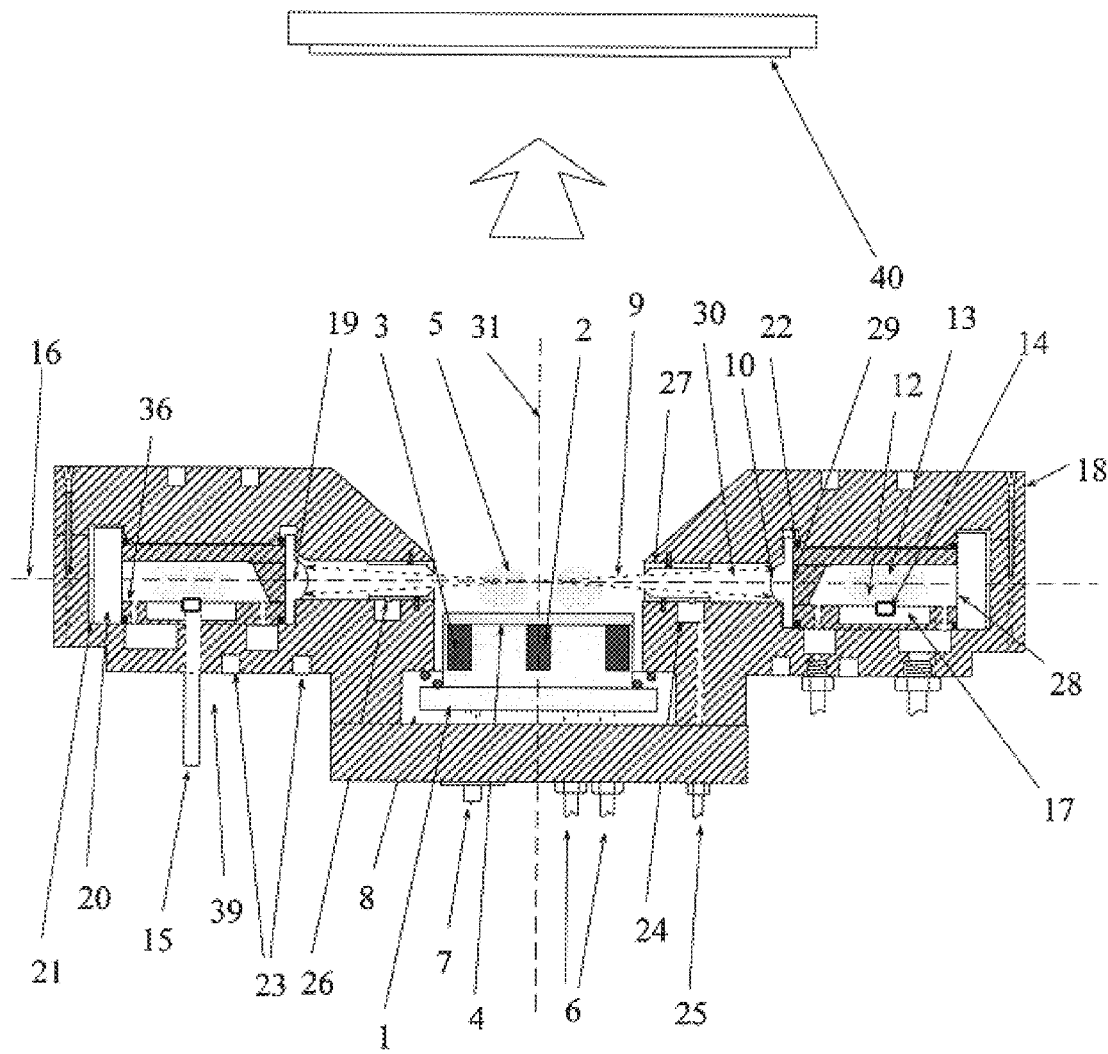
FIGS. 1–5 provide illustrations of the invention in its first preferred embodiment.
Figure 2:
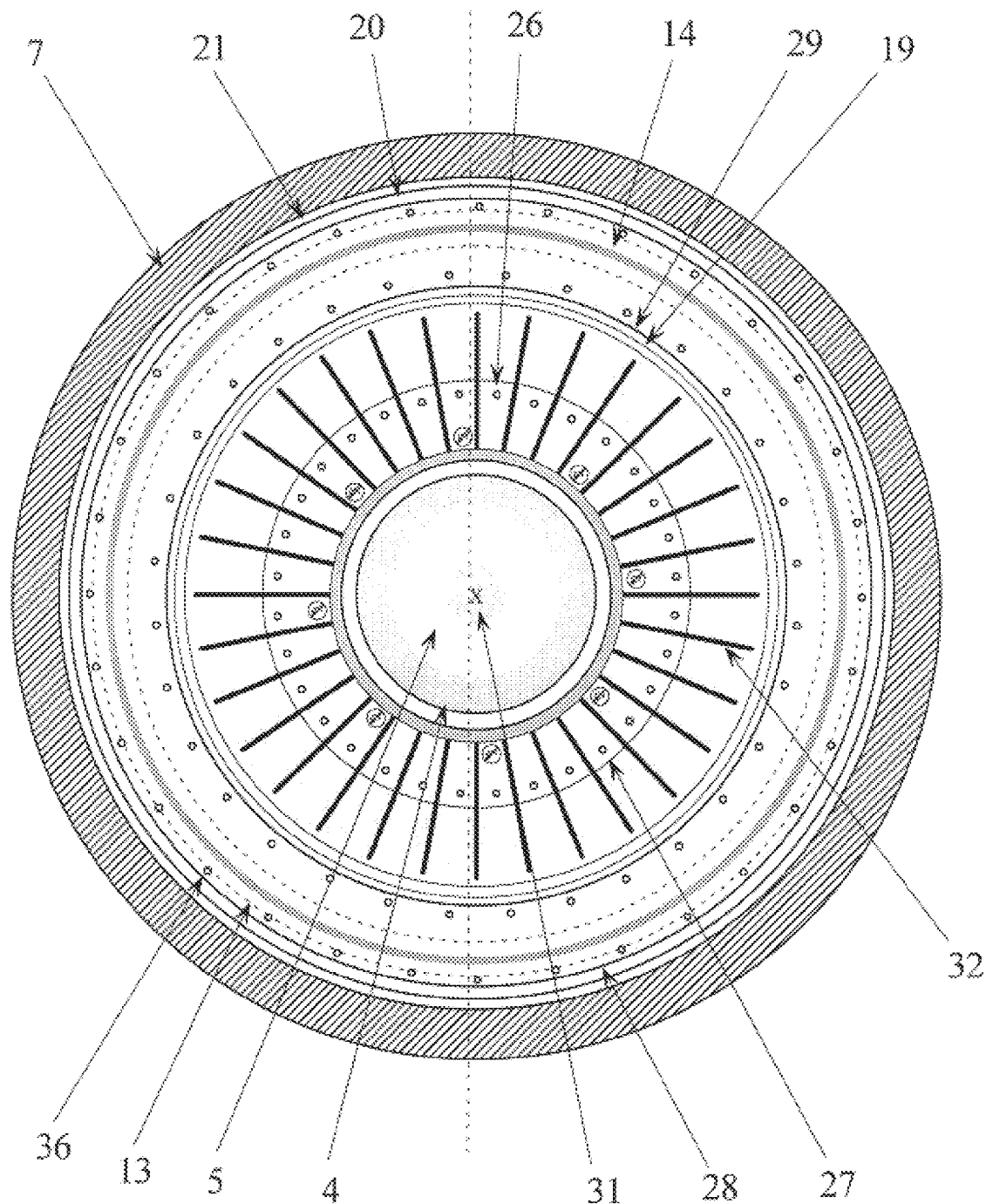

In one aspect, the present invention is disclosed herein as a vapor deposition apparatus utilizing, in the preferred embodiments, a plasma sputter electrode, and in particular, plasma sputter electrodes of the circular magnetron variety. In FIGS. 1–2, the present invention is shown, in its first preferred embodiment, using a circular magnetron sputter electrode (1), in which the plasma (5) is confined by a generally toroidal magnetic field formed by a concentric arrangement of central and outer magnets, where the central magnet assembly (2) is of opposite polarity of the outer (generally annular) magnet assembly (3). Many specific designs for the magnetron sputter electrode have been previously set forth in the art, wherein is disclosed various arrangements of field-shunting elements, auxiliary magnets, relative magnet strengths, and cooling strategies. Some of these latter considerations will be addressed when relevant to the disclosure of the preferred embodiment. In a manner consistent with the existing art, cooling water and power are supplied to the magnetron electrode via connections (6) and (7), respectively; and the electrode is appropriately insulated from adjacent surfaces by an electrical insulator (8). In FIG. 1, as in the other side view drawings of the present disclosure, the vertical dashed line (31) running through the center of the figure indicates the axis of rotational symmetry.

In the preferred embodiment, the sputter electrode (1) is integrated within the UV optical cavity housing (18) to form a single modular deposition source, therein allowing convenient and stable alignment between of the UV optical cavity and sputter electrode. The sputter electrode is positioned within the UV optical cavity housing, so that UV radiation may converge into the sputtering plasma volume via the annular aperture (30), after transmitting through the concentric and annular fused silica window (19). The propagation of UV energy is designated in FIG. 1 by the dashed paraxial rays (9). Outside and approximately concentric to this said window is an annular primary reflector (20), also constructed from fused silica. The inside surface of this primary reflector is coated with a multilayer dielectric (MLD) narrow-band reflector (28), and is sufficiently removed from the UV-producing lamp discharge (13) to prevent unnecessary degradation. The multilayer dielectric narrow-band reflector (28) can be fabricated variously, but, in the preferred embodiment, is comprised essentially of a large, odd number (e.g., 51) of alternating quarter-wave layers of low and high refractive index dielectrics, with the first and last layers being high index layers. Following portions of the present disclosure will discuss further the design and fabrication of the multilayer dielectrics incorporated in the cavity construction.

The annular window (19), surrounding the sputtering plasma periphery, allows the lamp discharge to operate at a gas composition and pressure that can be controlled independently from that of the sputtering process. It may be preferable, for some applications, that this window be constructed of $MgF_2$, $CaF_2$, or LiF, or other, single crystal, VUV-transmitting materials. However, these single crystal windows have many drawbacks; they tend to be relatively soft, can solarize easily, and are far less resistant to thermal shock than fused silica. The fluoride window materials are also relatively expensive, even if used in the simple form of segmented, planar windows. On the other hand, fused silica can readily be polished to a higher quality surface than the fluorides, is more easily cleaned, and can be fashioned into the preferred window/lens geometry. High quality fused silica (e.g., Schlieren-grade Suprasil), is therefore used as the window material in the preferred embodiment of FIG. 1. High grade fused silica will typically transmit at optical wavelengths down to 160 nm, corresponding to energies below about 7.9 eV; though, the flouride windows will offer greater transmission at these shorter wavelengths. In this way, radiation, of energy equal to or exceeding the ionization potentials of many elements and molecular species, can be focused into and/or above the sputtering plasma. In Table 1 are found a list of industrially important elements for which the ionization potentials are less than 7.9 eV. Of course, if higher energies are required, fluoride windows will be necessitated, with LiF crystal windows (although hygroscopic) transmitting down to 105 nm.

TABLE 1

Ionization Potentials of various elements.

| element | energy (eV) | element | energy (eV) |
| --- | --- | --- | --- |
| Al | 5.986 | Gd | 6.15 |
| Bi | 7.289 | Li | 5.39 |
| Ce | 5.539 | Mo | 7.09 |
| Cr | 6.767 | Nb | 6.759 |
| Cs | 3.894 | Nd | 5.525 |
| Er | 6.108 | SrO | 7 |
| Ga | 5.999 | Ti | 6.828 |

Figure 3:
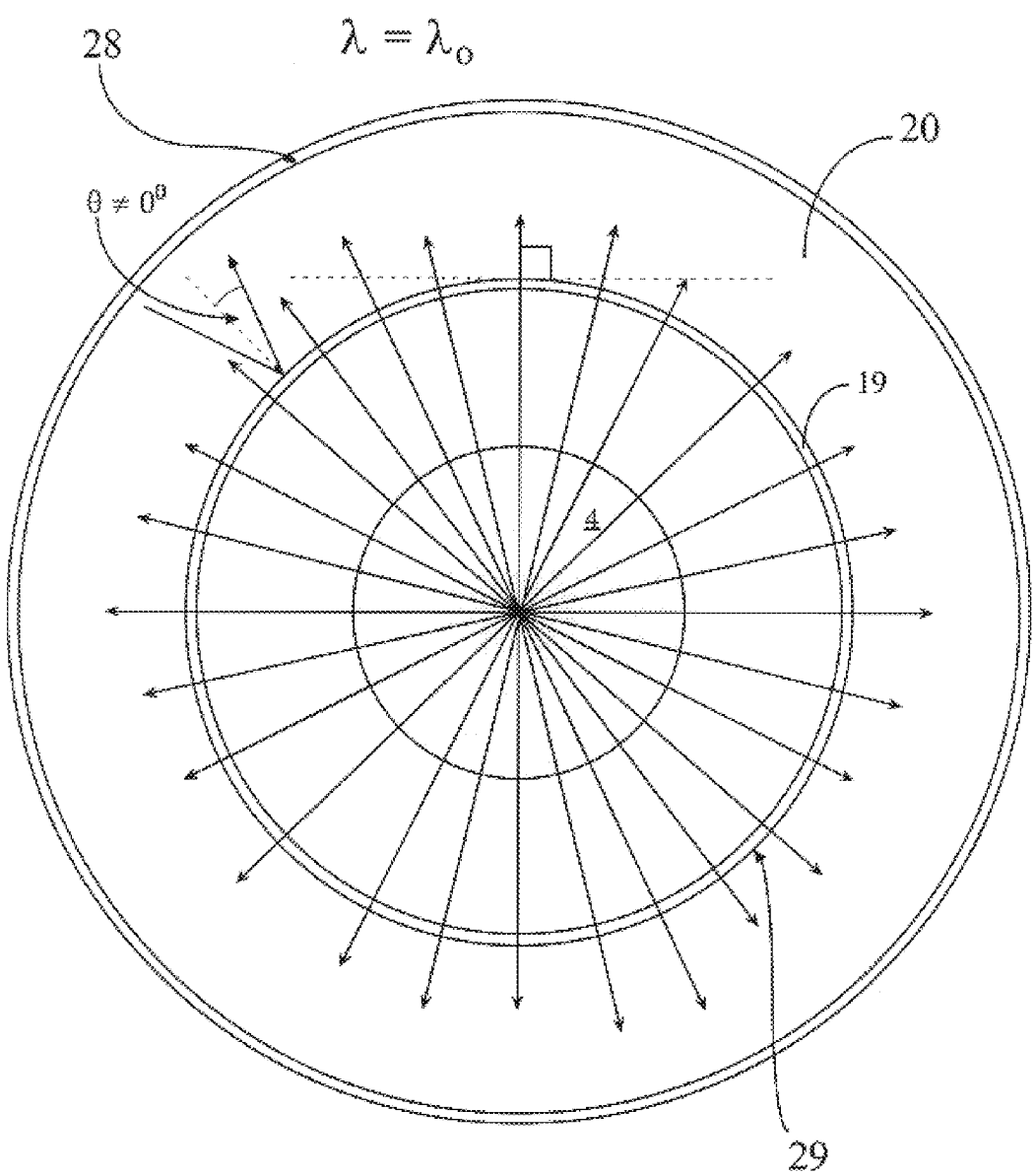

In FIGS. 1–3, the aforementioned annular window is fabricated, in the preferred embodiment, with an all-dielectric thin film Fabry-Perot filter (29) deposited on the outer surface of the annular window (19); as well as a multilayer dielectric anti-reflection coating (10) deposited on the inside surface. While thin film Fabry-Perot filters, including those utilizing a thick film cavity or multicavity configurations, have been fabricated in the past primarily for the purpose of achieving a very narrow transmission band (with half-widths down to about 0.5 nm) on essentially planar optical elements, the Fabry-Perot filter of the present invention is utilized in a novel optical configuration which allows it to fulfill several functions. Used in conjunction with other elements of the preferred embodiment, the unique transmission characteristics of the Fabry-Perot filter allows not only the production of well-defined narrow-band radiation, but also collimation of the lamp discharge emission, an increase in lamp discharge spectral intensity and spectral radiance, an increase in luminescent efficiency of the UV source, and the ability to spatially resolve UV interactions within the optical cavity's process space.

As is known in the art of optical interference filters, an all-dielectric thin film Fabry-Perot filter consists of one or more dielectric thin film half-wave cavity spacers, each sandwiched between reflective dielectric multilayers. While a more detailed account of these thin film filters may be found in the referenced literature, some particularly relevant issues will be discussed here. Let "H" and "L" each represent dielectric thin films of quarter-wave thickness, at the filter's peak transmission wavelength, for high and low refractive index materials, respectively. Then, a single-cavity Fabry-Perot filter can be deposited with the following sequence:

substrate/LHLHLHLH LL HLHLHLH/Vacuum where a single half-wave cavity spacer "LL" indicates a low-index, first-order spacer (m=1). The finesse, and fractional half-width of the filter's band-pass, can then typically be narrowed by increasing the number of iterations of alternating high and low index quarter-wave layers, $n_H$ and $n_L$, as well as by increasing the refractive index difference, $\Delta n = n_H - n_L$. Narrowing of the half-width of the band-pass can also be accomplished by increasing the order, m, of the cavity spacer (with index, $n_s$). This result is described according to the equation:

$$\Delta\lambda_h/\lambda_o = 4 n_L^{2x-1} n_s / m\pi n_H^{2x}$$

These results are given for normal incidence with a low-index spacer. For a deposited Fabry-Perot filter designed for peak transmittance, at normal incidence, of a center wavelength, $\lambda_o$, corresponding to a prominent emission line of the lamp discharge, the present invention will then allow for the focusing of this center wavelength at the central axis (31), as depicted in FIG. 3. As is also indicated in FIG. 3, UV of this center wavelength, $\lambda_o$, which is incident on the window at some oblique angle will consequently be reflected back into the lamp discharge volume, where it may be scattered, or, in some cases, absorbed and possibly re-emitted, spontaneously or induced, in the direction of normal incidence. As is indicated in FIG. 3, this substantially limits, at each point of incidence on the Fabry-Perot filter, the solid angle through which the UV radiation may propagate into the central process space.

The collimation, with respect to a vertical plane containing the central axis (31) in FIG. 1, of UV produced by the lamp discharge, due to both the cavity reflector and the Fabry-Perot filter, also allows for the more effective utilization of the annular window (19) as a refractive element. While the curvature of the inner surface of the window (19)

is exaggerated in FIG. 1 for demonstration purposes, this surface can be fashioned with a convex cross-section—resulting in a toroidal inner surface—to allow focusing of the transmitted UV along the direction parallel to the central axis (31), as demonstrated by the converging paraxial rays (9) in FIG. 1. This focusing further allows the use of the annular field stop (27), which, aside from preventing window contamination, allows a more precisely defined volume of UV-plasma interaction.

The utility of such all-dielectric, thin film, narrow-band optical filters is usually hampered by broad transmission side-bands at both the short and long wavelength sides of the resonance peak. Whereas the short wavelength transmission side-band can be blocked with relative ease, by choosing a window material with an appropriate shortwave absorption cut-off, blocking the longwave side-band can be more problematic. However, these difficulties are overcome, in the preferred embodiment, through the use of a low-pressure excimer glow discharge as the lamp discharge. As will be discussed further, these efficient, low-pressure, excimer-based, ultraviolet-emitting discharges allow the production of an unfiltered UV-visible spectrum consisting of essentially only two or three narrow lines, corresponding to excimer transitions, closely grouped within a small interval (e.g., $\Delta 50$–$100$ nm) in the far and vacuum UV. As such, these sources produce relatively little spectral emission in the near UV and visible, where the longwave transmission side-bands would typically lie for a Fabry-Perot filter used in the present invention. In addition, the processes of interest will tend to be relatively insensitive to these longer optical wavelengths.

In the preferred embodiment of FIGS. 1–3, the primary reflector surface is flat in its radial cross-section, resulting in a reflective surface for effectively retaining UV radiation directly emitted by the annular lamp discharge (13), as well as radiation which has already passed through the central process space one or more times. As is indicated by FIGS. 1–3, radiation which irradiates the central process space must first propagate within the acceptance angle of the multilayer dielectrics disposed on the window (19) and primary annular reflector (20). The primary reflector is fabricated of fused silica for resisting thermal shock as well as to transmit unwanted propagation out of the cavity, with a thin thermally (and electrically) conducting polymer buffer layer (21) for maintaining uniform thermal contact between the primary reflector and the cooled housing. This latter buffer layer (21) may be composed of other materials, as well, as its function may vary with application; in some cases, it may be preferable to directly liquid cool the primary reflector. However, as the narrow-band reflector (28) deposited on the primary reflector surface allows transmission of infrared—comprising a cold mirror—from the lamp discharge volume, and as the conducting polymer buffer layer and cooled housing also serve well to absorb and remove this IR energy, this latter configuration serves well to efficiently remove heat from the lamp discharge volume.

The reflective coatings utilized in the present invention may be designed in many configurations, depending on the application. Quarter-wave stacks—using, for example, $SiO_2$ and $Al_2O_3$—deposited by reactive sputtering, ion-beam, or e-beam deposition, routinely provide reflectivities exceeding 95% at ultraviolet wavelengths less than 200 nm, with high damage thresholds, and little degradation over time. When utilized as the reflector (28) in the preferred embodiment, the multilayer dielectric reflector is designed with peak reflectivity corresponding to a prominent emission line of the lamp discharge, as well as to the transmission peak—for the desired transmission angle—of the Fabry-Perot filter, thereby allowing the selected wavelength to dominate the optical spectrum within the reflective cavity. In some instances, it may be desirable to forego implementation of the multilayer dielectric Fabry-Perot filter, as when the multilayer dielectric reflector and other collimation optics of the invention provide an adequately collimated, narrow-band emission to reliably excite the plasma species. Design of the multilayer dielectric narrow-band reflector, when utilized in the primary annular reflector, will also depend, in part, upon the cross-sectional curvature chosen for the primary annular reflector. The figure given to the primary reflector cross-section may be chosen differently—for instance, it may be parabolic—depending on such factors as the choice of lamp discharge, the width of the spectral band to be retained, the efficiency of the reflective and filter coatings, and the precise configuration chosen for the UV optical cavity. When, as in the preferred embodiment, the primary reflector is designed with a flat, or near-flat, cross-section, the multilayer dielectric coating may then be readily designed with a maximum reflectance, at the wavelength of interest, for normal-incidence reflection. The sensitivity of these MLD reflectors to the angle-of-incidence of the UV radiation may be increased through design techniques known to those skilled in the art of MLD filter design, these techniques being provided in the referenced texts. Generally, it may be said that the sensitivity of the reflectance to angle-of-incidence, for the emission line of interest, can be increased through utilizing a small refractive index spit, $\Delta n$, in combination with a large number of iterations of the quarter-wave pair.

Figure 5:
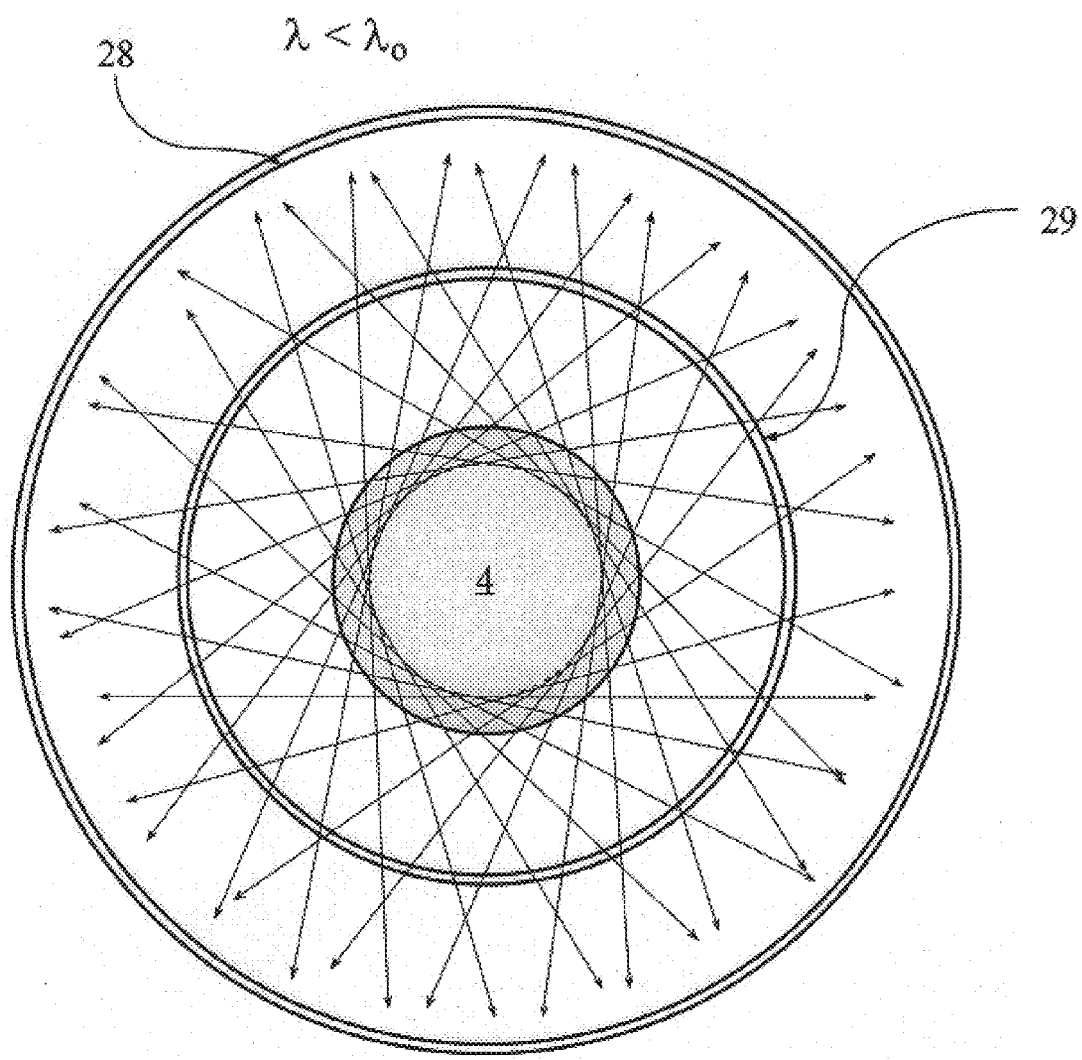

As an example, if the Fabry-Perot filter of the preferred embodiment is tuned to transmit 214 nm at normal incidence, the lamp discharge, which may be operated at higher powers and pressures than the sputtering plasma, will transmit this wavelength only when it is focused at the geometric axis of the plasma, as illustrated in FIG. 3; otherwise, it will be reflected back into the lamp discharge volume. This particular wavelength will thus enjoy a relatively small focal point (and high power density) at the center of the sputtering plasma, due to the effective high numerical aperture of the optical system. As a further illustration, if aluminum, with an ionization potential of 6 eV (210 nm), is sputtered with the invention as constructed in FIG. 5, the Fabry-Perot filter and lamp discharge emission may be tailored to focus that energy (or somewhat higher) within an annular volume directly over the annular erosion groove of the sputtering target (4), as depicted in FIG. 5. Since, in a circular magnetron sputtering plasma, electrons, neutrals, and ionic species preferentially occupy various annular regions in and above the sputtering plasma, this concentric UV lamp configuration allows for focusing specific optical energies discriminately at specific constituent species of the sputtering plasma.

A difficulty in employing a transmitting window in the proximity of any vapor deposition process lies in the need to prevent material from depositing on the transmitting surfaces. While the low aspect ratio of the UV optical cavity's process space allows more precise control over the interaction mechanisms occurring in the sputtering plasma, it also aids in preventing the contamination of those optical surfaces which couple UV into and out of the sputtering plasma. In the preferred embodiment, an annular cavity (30) is formed by the UV optical cavity housing (18) which significantly reduces line-of-sight contamination from the sputtering plasma. Although the device shown in FIGS. 1–4 utilizes a particular ratio of window radius to sputter electrode radius, the relative size of the window and reflector radii can be scaled up so as to substantially remove the transmitting surface(s) from the proximity of the sputtering plasma. As the mean free path (m.f.p) of gas and vapor species will remain constant under identical process pressures, the probability of window contamination will decrease substantially for cavity path-lengths far exceeding the m.f.p. of the chamber background pressure. This scaling up of the cavity radii relative to a given sputter electrode will also enable the use of far higher powers by which to sustain the lamp discharge(s), and hence, higher radiation densities available in and/or above the sputtering plasma.

Increasing the m.f.p. within the annular cavity is achieved with the field stop (27), the latter which, aside from enabling more precisely controlled UV interaction with the sputtering plasma, aids in the prevention of window contamination in two ways: first, the field stop significantly prevents sputtered vapor from entering the annular cavity region, where both line-of-sight and scattered vapor paths may result in window contamination, and second, the field stop effectively throttles process gases which are emitted into the annular cavity via gas supply inlet (25), ballast channel (24) and a symmetrical arrangement of gas ports (26). The latter throttling effect allows the m.f p. within the annular cavity to be much smaller, especially at high flow rates, than the process pressure, further ensuring the high scatter and subsequent gettering of sputtered vapor by the cooled surfaces of the annular cavity. This gettering can be increased by the optional implementation of radial dividing surfaces (32), depicted in FIG. 2, between the upper and lower surfaces of the annular channel, which also lowers conductance for the exiting process gas. The gas ports (26) are appropriately small and sized to provide even distribution of process gases throughout the annular channel. The entire aperture baffle assembly is constructed from aluminum alloy for high thermal conductivity to the cooling lines (23).

When the luminous power density supplied by the lamp discharge is sufficiently high, at energies equal to or exceeding ionization potential(s) of the process vapor species, the process vapor atoms approaching the window will increasingly tend towards being in an ionized state. This allows the further elimination of deposition on the window, as these ionized particles may then be electrostatically pumped and cold-trapped by the grounded (or electrically biased) surfaces in the annular channel.

These aforementioned methods for eliminating deposition of material on the annular window may be used separately or in combination. The most effective solution will depend on the particular process. In some instances, it may be easier to periodically clean the window, rather than to employ many vapor-trapping surfaces within the annular channel. When geometry allows, it may also be advantageous to increase the diameter of the annular window (and the UV source) to sufficiently preclude its contamination.

The discussion so far has focused on the design of an optical cavity which maximizes the optical energy present, at wavelengths of interest, for optically coupling the sputtering plasma (5) and a lamp discharge (13), in a rotationally symmetric distribution. The present disclosure will now proceed to discuss the lamp discharge. While other means may be utilized to pump a photoemitting gas, such as laser pumping or electron beam pumping, the discharge sources, and in particular, low pressure, excimer-based discharge sources, are particularly well-suited for use in the ultraviolet lamp source disclosed herein. Commercially available ultraviolet sources, such as low pressure Hg lamps, and common discharge gases, such as $N_2$, can produce UV emissions in the range of interest. However, the rare-gas dimers and rare-gas monohalides are preferred for efficient production of narrow-band emission in the far UV and VUV range below 250 nm, particularly the rare-gas monohalides, in which the well-known "harpooning" reactions allow particularly high cross sections in creating the excited molecule. In Table 3, various excimer transition wavelengths are shown. The use of these luminescent exciplex molecules in incoherent emission discharge sources, or exilamps, allows high efficiency and high power output, in narrow spectral bands centered about these excimer transitions. At low pressures (typically<20 torr), stable, continuous discharges may be readily sustained; and, simultaneously, the reduction in such mechanisms as collisional quenching produce a commensurate drop in non-radiative decay processes. This, and the lack of pressure-broadening at these lower pressures, apparently enables a resulting UV-visible emission spectra consisting in many cases of primarily a narrow (B-X) excimer band, accompanied only by nearby, much weaker, transitions such as the shorter wavelength excimer (D-X) band.

Very large fractions of the optical spectral output for excimer discharge sources have been found to exist within a relatively small spectral band (<10 nm). In the present invention, by resonating in the previously described circular Fabry-Perot cavity, this band can be isolated and stabilized. An atomic or molecular species, existing in the process volume at the center of the circular cavity, will possess absorption cross sections which show a maximum starting at its ionization potential, and continuing into shorter wavelengths, usually for one to several tens of nanometers. A portion of these resulting absorption bands may then be matched by the transmission characteristics of the circular Fabry-Perot filter and integral excimer discharge.

TABLE 3

| Excimer transitions of selected gases | | | | |
| --- | --- | --- | --- | --- |
| Kr | $Xe_2$ | ArF (B-X) | KrCl (B-X) | XeCl (B-X) |
| 146 nm | 172 nm | 193 nm | 222 nm | 308 nm |

In the first embodiment of the present invention, as illustrated in FIGS. 1–4, the lamp discharge is created in a separate annular volume (12) existing between the annular window and the annular primary reflector. Cooling of the lamp discharge (13) has been found important in achieving efficient luminescence in excimer-based lamps, especially at higher power deposition, and the lamp discharge enclosure is designed to maximize heat dissipation. As the total pressure of the discharge gas is lowered, the proportion of gas-phase collisions to wall collisions drops, and cooling of the enclosure walls allows an effective means for cooling the discharge gas. Where as, the primary reflector is cooled by heat-sinking through the multi-layer dielectric cold-mirror reflector (28) described earlier, the upper and lower surfaces of the lamp discharge volume (12) are Ni-coated copper, which is well-cooled by cooling lines (23). As both copper and nickel surfaces tend to form a thin film of a metal-halide compound in halogen-containing atmospheres, these metals can be sufficiently passivated for use in the present invention. Degradation of these surfaces is also somewhat slowed, due to the predominance (often >90%) of the inert host gas used in these excimer-based UV sources. However, long-term and stable operation can be, typically, more easily achieved using all-dielectric enclosures for sustaining a high frequency electrodeless discharge. In this case, to retain efficient heat dissipation, the metal surfaces of the lamp discharge enclosure can be coated with a halide-resistant insulating dielectric layer, such as $Al_2O_3$. Another option is to over-coat the metal electrodes with a fluoride glass, as taught in U.S. Pat. No. 5,062,116, "Halogen Compatible High-frequency Discharge Apparatus". The annular volume is pumped separately and is capable of sustaining a pressure and gas composition distinct from that of the sputtering process. The electrode (14) used for generating the lamp discharge is constructed of approximately ¼"-wide nickel-coated copper channel, and water-cooled. The electrode is positioned within the lamp discharge volume (12) on an insulating alumina foundation (17). Power is supplied to the lamp discharge electrodes (14) through the power lead (15), which is also the ¼" Ni-coated copper channel which forms the electrode (14) and provides the supply and return coolant. The power lead (15) is insulated in a Teflon sleeve to prevent it from grounding on the housing. The vacuum seals not shown in the drawings, for sake of clarity, are conventional seals which may be constructed variously by one skilled in the art of vapor deposition. The o-rings (22) are shown, as they aid in clarifying the construction. The lamp discharge is electrically sustained with an alternating current power source, with stable operation most readily achieved at frequencies atleast in the RF range, above 100 kHz.

For the present invention, the low-pressure excimer discharge source has been found to provide the best characteristics; however, the particular electrode design used and described above is provided for instructional purposes. Many UV-producing discharge designs can be integrated into the present invention. Designs which have been introduced in the art include high and low pressure discharges, transverse and longitudinal discharges, D.C., R.F., microwave discharges, and barrier discharges. Various other discharge means may be incorporated to provide UV emission without departing from the scope of the invention. Some of these alternative configurations will be presented in the alternative embodiments.

Figure 4:
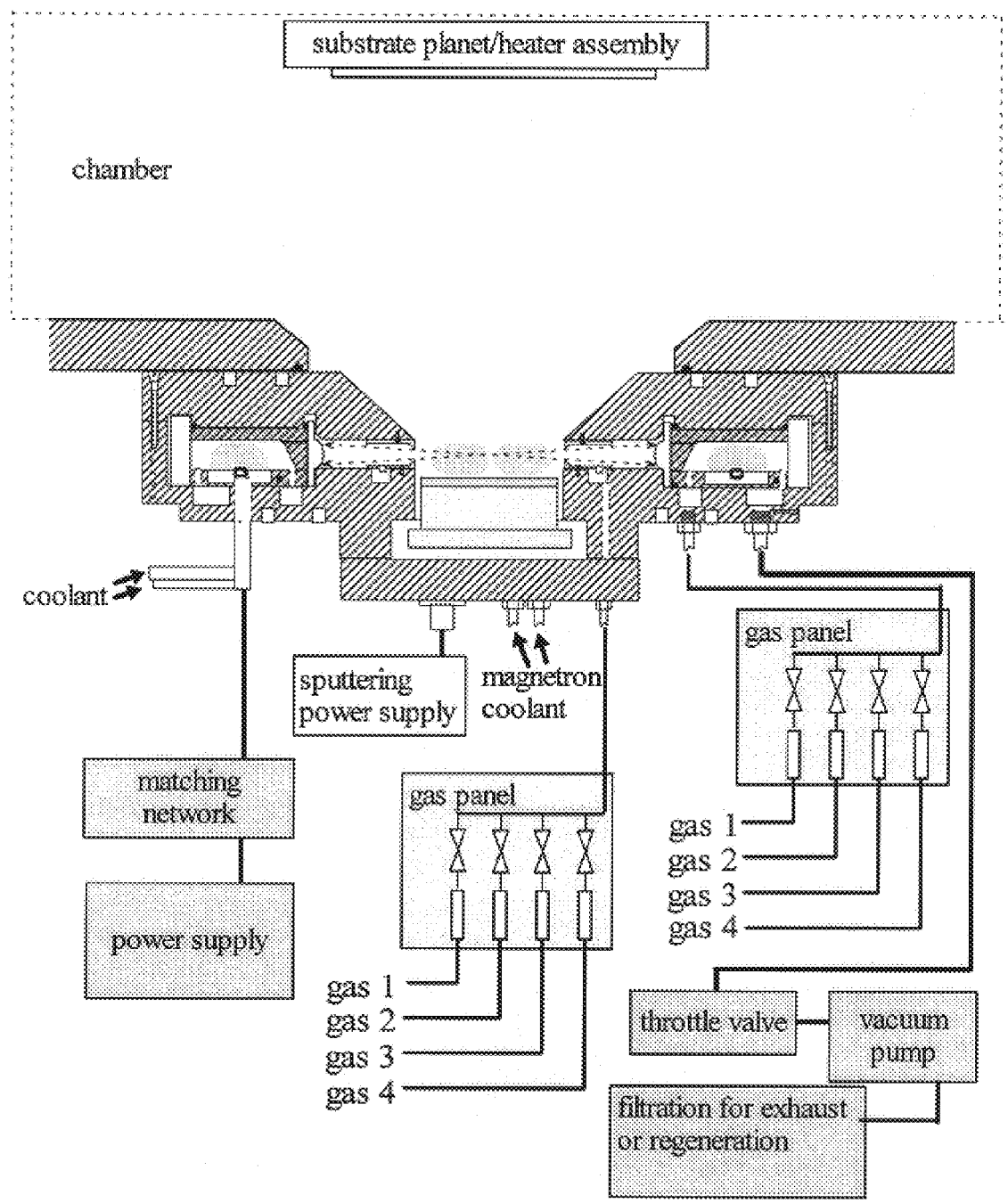

In FIG. 4, the UV optical cavity, as illustrated in the previous discussion and FIGS. 1–3, is depicted in the context of the typical accompanying equipment required for its operation. In the embodiment of FIG. 4, the use of a gas flow in the lamp discharge is used to maintain reliable spectral emission; though, sealed-off UV sources might also be used, as they are made available. The use of such expensive gases as xenon would typically involve regeneration of exhaust gases in a recirculating gas flow.

As the angle of incidence, for UV radiation incident on the annular window (19) of FIGS. 1–3 becomes more oblique, the peak transmittance of the Fabry-Perot filter will shift toward shorter wavelengths, these shifts being more pronounced for low-index cavity spacers than for high-index ones. While the degree of this peak shift will depend on such issues as phase dispersion and the change in optical admittance with increasingly oblique incidence, the fractional shift in the peak transmittance will change generally with the phase thickness shift, and as such, will be slightly less than cos Θ, where Θ is the angle from normal incidence. A specific angle of incidence on the window will then allow a specific narrow wavelength interval, Δλ, of UV transmission, reflecting all others of the same order. In this way, the window will transmit into the central process space with a specific narrow wavelength band focused at a unique radial distance from the center of the plasma. If the Fabry-Perot filter is designed for transmission of a lamp emission line, $\lambda_1$, at a specific oblique angle from normal incidence, a specific "mode" of transmission, for this wavelength, will resonate within the reflective cavity as shown in FIG. 5, similar to the way specific modes are tuned for in a conventional resonator. The actual resonator in FIG. 5 consists of the thin film Fabry-Perot filter (29), the transmission of which is matched to the reflectance of the concentric MLD reflector (28) disposed on the annular reflector. The result is that all light that is within the filter's angle-dependent band-pass, and that is rendered parallel to the horizontal plane designated by (16) in FIG. 1, will be utilized within one of the modes typified in FIG. 3 and FIG. 5 (granted it be within the acceptance angle of the filter/window). While none of these allowed modes will necessarily experience any type of net gain, their retention within the reflective cavity can nonetheless serves to promote excitation and relaxation within the corresponding atomic or molecular transition.

A resulting benefit of the invention, as disclosed in the embodiments of FIGS. 1–5, is the spatial resolution of the spectral energy levels transmitted through the window. While the longest wavelength transmissions will pass, at normal incidence, through the central axis (31), successively shorter wavelengths will be restricted to pass into the central process space only as tangents to a circle of commensurately larger radius, as demonstrated in FIG. 5. The range of UV wavelengths transmitting through the window at a given angle will depend on such issues as the sharpness and spectral location of the lamp discharge emission line, and the particular design and fabrication of the Fabry-Perot filter, which will determine such characteristics as the FWHM of the Fabry-Perot filter's band-pass at a given angle-of-incidence. In the preferred embodiments of FIGS. 1–4, the full range of UV wavelengths transmitted through the sputtering plasma, from the center of the sputter electrode to its edge, would typically be less than Δ20 nm; this is given for the chosen ratio of diameters for sputter electrode and annular window (about 1:3), and a FWHM (for filter of relatively low finesse) of about 10 nm. Far higher resolution than this preceding example is possible with the Fabry-Perot filter design and may be exploited for various purposes, though possibly at the expense of net transmission into the sputtering plasma volume. Due to the triangular shape of the band-pass for a single-cavity Fabry-Perot filter, the relatively broad band-pass chosen—to achieve higher overall transmission in the given spectral region—still results in the predominance of a relatively sharp peak transmission at a specific angle of incidence. While multi-cavity thin film Fabry-Perot filters allow a sharper transmission drop-off and square transmission band, the single-cavity Fabry-Perot filters are more easily fabricated to possess a sharp transmission peak and a small FWHM, when needed.

Given the abrupt rise in real refractive index—or high optical dispersion—for most VUV-transmissive materials below 250 nm, the aforementioned Fabry-Perot filter and other multilayer dielectrics may be, in various circumstances, designed for the underlying window's admittance only at a specific wavelength and angle of incidence, resulting in a further restriction in the passable wavelength band, angle of peak transmission, and solid angle of transmission. In some instances it may be preferable to allow transmission only for a narrow spectral range at, or very near, normal incidence, with the shorter wavelengths which normally transmit at oblique incidence being reflected due to phase dispersion, or suppressed due to the window material's absorption cut-off; this allows the Fabry-Perot to be used more effectively as a collimation means, while relying less on the field stop (27). Also, while a broader transmission band may be preferred, in some circumstances, to increase the transmitted flux, a narrow transmission band allows for changes in the transmitted optical power, due to the accumulative modification of cavity surfaces by the lamp discharge, to be more easily monitored—by photodetection rather than spectroscopic means—and easily corrected via the lamp discharge power input.

Figure 6:
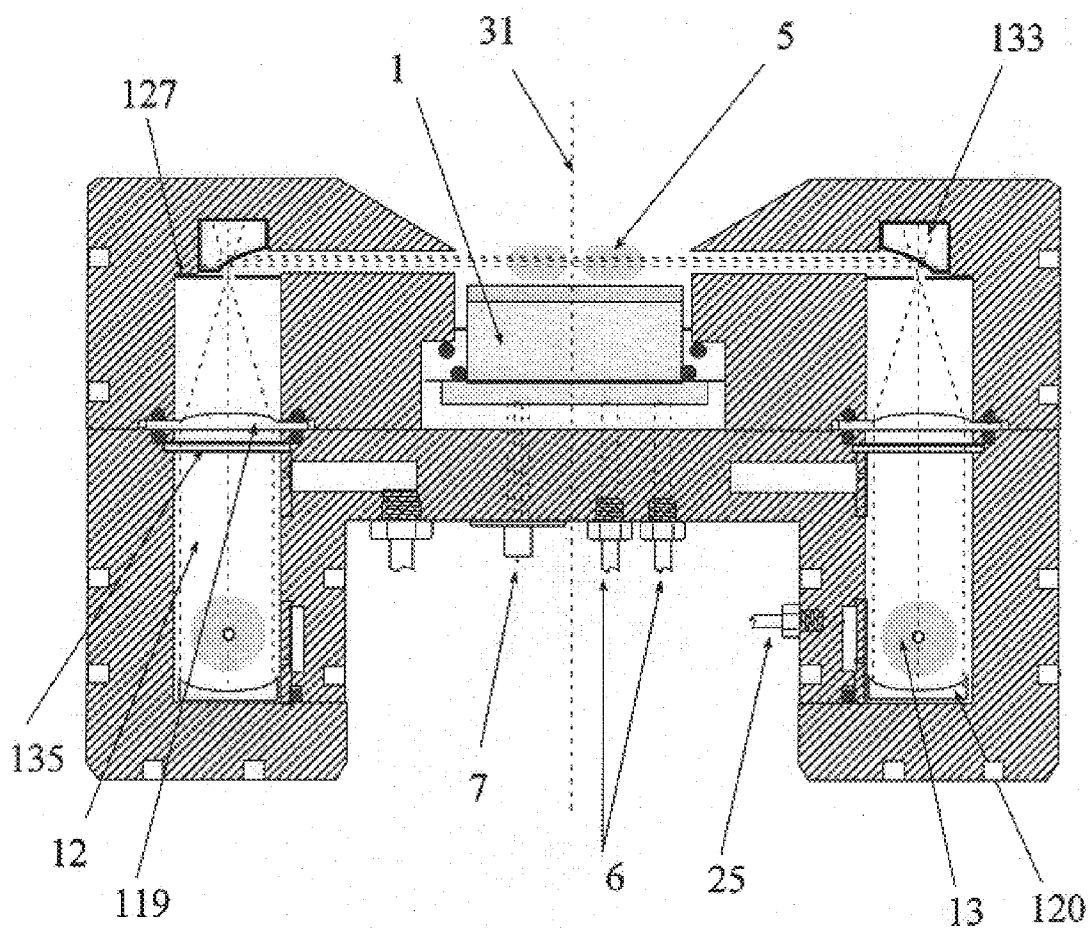
FIGS. 6–10 serve to illustrate various alternative embodiments of the present invention.
Figure 7:
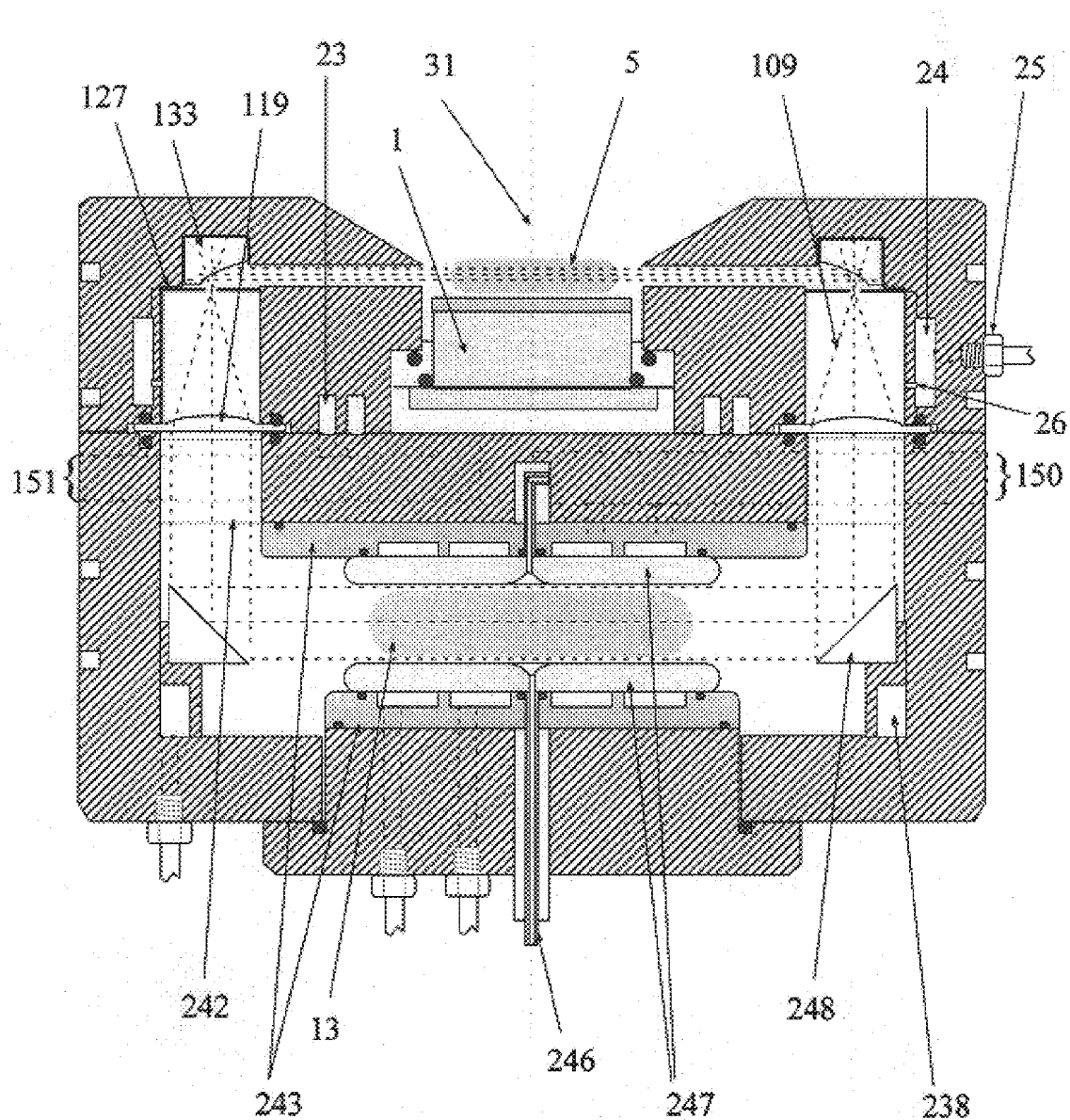

While the embodiments discussed in the preceding descriptions have been based on the invention as depicted in FIGS. 1–5, other variations, which are portrayed in FIGS. 6–10, will perform the same principle functions, but with various advantages in specific circumstances. The embodiments in FIGS. 6–9 serve, in part, to demonstrate the general use of folding mirrors and other optical elements in the present invention, to expand the range of possible optical cavity configurations. The configurations of FIGS. 6 and 7 both allow the annular window (119), separating the sputtering and lamp discharges, to be placed out of the direct view of the sputtering plasma, hence allowing further means to prevent window contamination. Window contamination is then essentially eliminated by means of the field stop (127). Ultraviolet energy from the lamp discharge is, in both of these variations, re-directed, collimated (again, only in the plane of the drawing), and condensed by means of an annular secondary reflector (133), which, in FIGS. 6–7, is depicted with an off-axis parabolic reflector, the foci of which corresponds to the image foci of the toroidal thin lens (119), as well as to the aperture center of the annular field stop (127). While the deposition of material on the window (119) by the sputtering plasma can be completely avoided through the embodiments of FIGS. 6 and 7, material adsorption on the secondary reflector (133) can be avoided by the same methods described for preventing window contamination in the embodiments of FIGS. 1–5. The ability of the secondary annular reflector to condense the propagation of the UV to a physically thin planar volume also allows a means for narrowing of the cavity aperture exposed to the sputtering plasma. In many cases, contamination of the secondary reflector will be less critical than in the case of the window of the invention's first embodiment, especially when the contaminant is of a highly UV-reflecting metal (e.g., aluminum) and does not drastically reduce reflectance. Contamination of the secondary reflector is also less an issue as the secondary reflector may be considerably further displaced from the sputtering plasma than the window of the first embodiment, given the same reflective cavity diameter.

As in the embodiments of FIGS. 1–5, the collimation, within the plane of the drawing, of UV radiation incident on the thin lens/window (119), in FIG. 6, can be enhanced by the utilization of a multilayer dielectric narrow-band reflector as the primary cavity reflector (120). Again, the passage, for use within the process volume, of UV collimated so as to propagate only within the reflective cavity, is further insured by the use of the annular field stop (127). In these alternative embodiments that utilize secondary reflectors, the retention of UV within the closed optical paths of the reflective cavity is more effectively achieved with the narrow band-pass filter, deposited on the window (119), tuned for a prominent spectral emission at normal incidence. Because of the effectiveness of the annular field stop (127) and annular thin lens/window (119) in confining the UV within a planar process space above the sputter electrode (1), the narrow-band filter might be omitted, for some applications, in this construction of the optical cavity.

The alternative embodiment of the invention as depicted in FIG. 6 may offer advantages over the first embodiment of FIGS. 1–4, in terms of providing economical design and further preventing window contamination. The alternate configurations of FIGS. 6 and 7 will also allow for maintaining a large lamp discharge volume where space constrictions preclude use of the embodiments of FIGS. 1–5. The alternative embodiment of FIG. 6 also shows an optional second window (135) which may be placed in the optical path, before the thin lens, to perform the function of an interference filter. This planar window, when fabricated as an etalon, would allow an increase in finesse when used in combination with the thin-film filter.

A third embodiment of the invention, depicted in FIG. 7, allows the utilization of a different electrode geometry. In this latter embodiment, the electrode and lamp discharge geometry may be more localized than in the previous embodiments, allowing for alternative UV-emitting discharges to be incorporated. Rather than the primary reflector surface (120) of FIG. 6, the alternative annular reflector (248) is used in FIG. 7, in conjunction with annular secondary reflector (133), to retain the selected UV radiation in a closed loop optical path. In this embodiment, the resultant optical paths essentially converge, within the horizontal plane, at both the sputtering plasma and the lamp discharge, as indicated by the dashed lines (109). The depiction in FIG. 7 also serves to demonstrate the invention when used with a simple glow-discharge sputtering plasma, without magnetic confinement, though this embodiment of the invention could as easily be used with a magnetron sputtering plasma. The sputter electrode is rigidly suspended within the cavity by the intermittent radial struts (242), which also provide the needed access feedthroughs for power and water. The opposing nickel-coated electrodes (247) are constructed, with aluminum oxide insulators (243), in a symmetric fashion, in a geometry conducive to the precise alignment and cooling requirements necessary for high pressure, high voltage, pulsed discharges. While the gas system geometry depicted, with inlets (246) and exhaust ballast (238), would only be adequate for low pulse rates, the possibility exists, as in previous embodiments of the invention, for the sputtering plasma to provide UV pre-ionizing radiation for the lamp discharge, or vice-versa.

Figure 8:
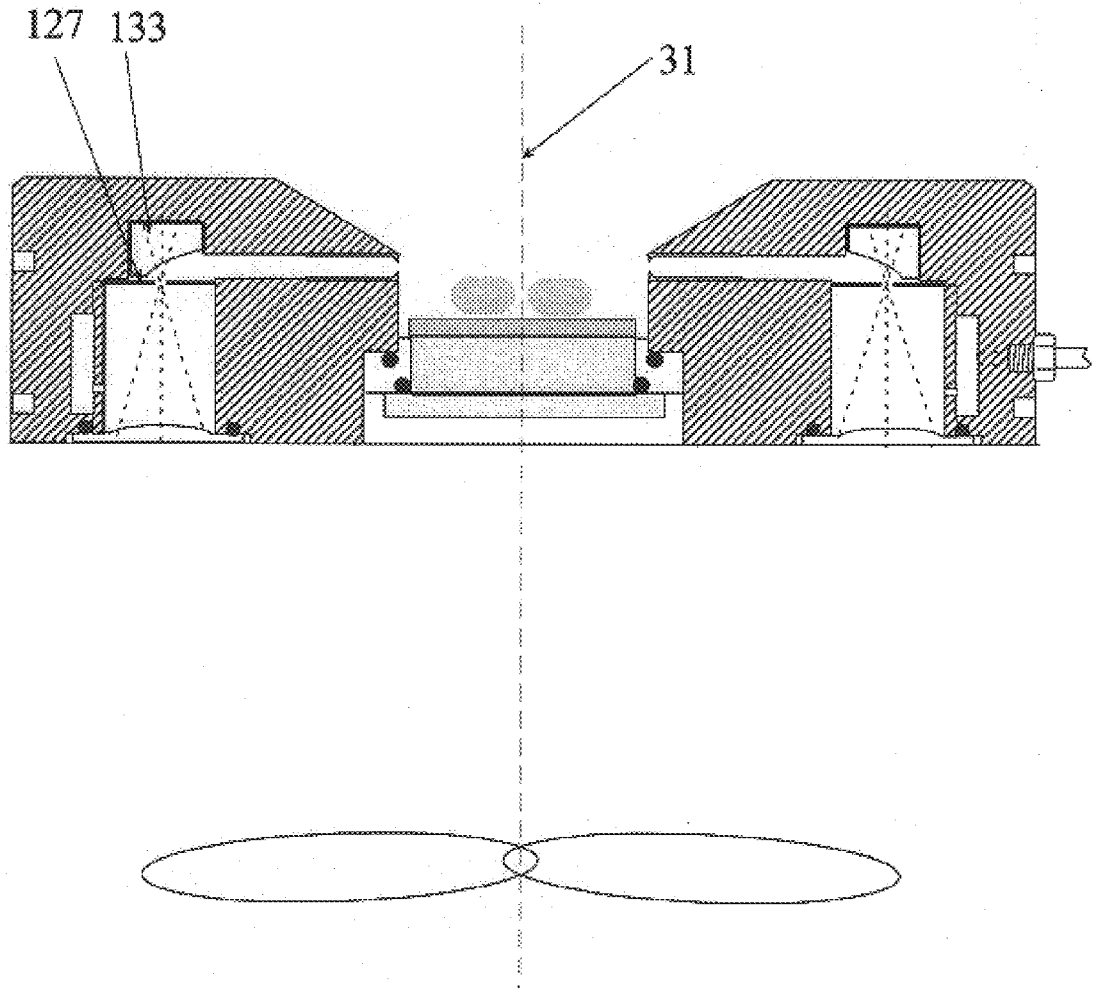

The secondary reflector (133) may, instead, be fabricated with an off-axis elliptic cross-section, which, as depicted in FIG. 8, allows focusing of the UV along a focal axis parallel to the magnetron axis (31), as was illustrated by the converging paraxial rays (9) in FIG. 1. By designing the off-axis reflector with an elliptic cross-section, the field stop configuration (27) shown in FIGS. 1 and 2 may be similarly used to prevent adsorption of material onto the off-axis secondary reflector (133), in FIG. 8. The two intersecting ellipses, depicted underneath the side view presented in FIG. 8, demonstrate the cross sectional figure required of the annular secondary reflector (133), wherein the outer foci of the two ellipses coincide with the field stop (127) aperture, and the two ellipses share the same focal point at the central axis (31), which may preside within or, as in FIG. 8, above the sputtering plasma.

For spheric or aspheric reflector cross-sections that have shorter radii of curvature, and must reflect a broad range of angle-of-incidence, a broad-band protected aluminum reflection coating would typically be preferred. While aluminum broadband reflection coatings can provide high reflectivity (>90%) even for UV below 200 nm, some degradation tends to occur even for aluminum coated with a thin (e.g., ½ wave) dielectric protective layer. However, because of the wide range in angle-of-incidence, metallic reflective coatings may be preferred for the off-axis secondary reflectors utilized in FIGS. 6 and 7. Anti-reflection coatings (10) deposited on the annular window (19) may also be designed variously, depending on the application.

While many existing designs may be incorporated, the narrow-band requirements of the preferred embodiment allow a relatively simple three-layer "V-coat" to perform quite adequately. An anti-reflection coating is not required for a surface on which the Fabry-Perot filter is already disposed, as the latter filter performs this function already.

Figure 9:
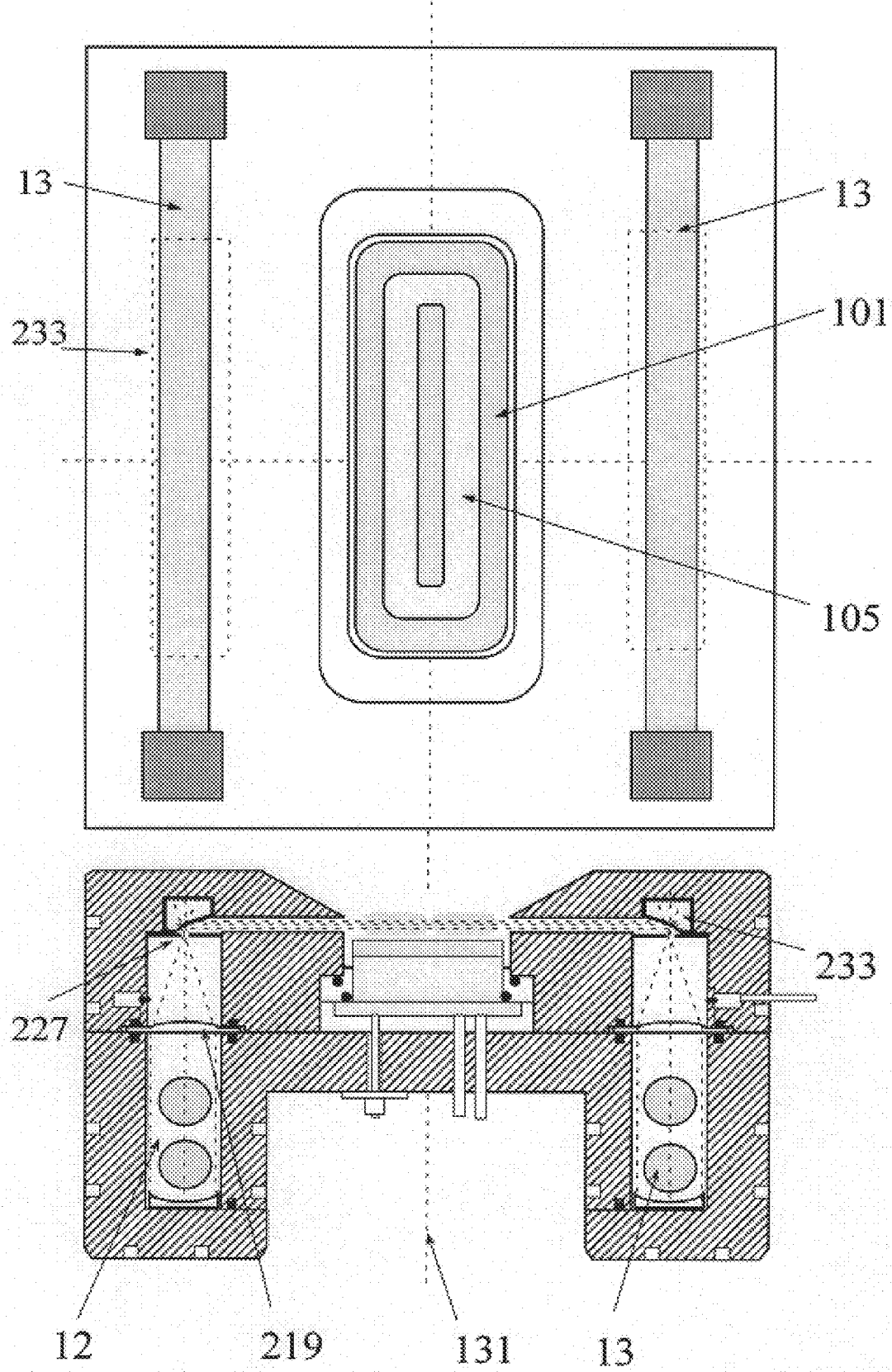

Though the preferred embodiments utilize a circular planar magnetron, the same principles can be extended to non-planar circular magnetrons, utilizing, for example, conical or stepped targets, located similarly to the target (4) in FIG. 1. Rectangular magnetrons may be incorporated, as well, into an apparatus constructed using the principles of the present invention, as is illustrated in FIG. 9, wherein, as is established in the art, the rectangular sputter electrode (101) sustains an elongated sputtering plasma (105). This rectangular magnetron differs from previous embodiments, in that the UV-producing lamp discharge, and its accompanying reflective cavity, is now in the form of two opposing, straight, parallel volumes, rather than the essentially single, circular volume of FIGS. 1–5. The optical elements depicted in FIG. 9 are different from previously discussed embodiments of the present invention, in that they are now designed to allow a symmetric irradiation of a rectangular sputtering plasma (105). The axis of symmetry (131) now designates the long axis of two-fold symmetry for the rectangular sputtering plasma (105). The field stop (227), cylindrical lens (219), and secondary reflector (233), are accordingly linear in FIG. 9, and are positioned on either side of the chosen axis of symmetry (131), preferably allowing a symmetrical irradiation of the sputtering plasma in question. The embodiments of FIG. 9 also serve to demonstrate the use of tubular excimer lamps. The use of sealed-off excilamps may become more economical if commercially available versions become available. The eventual availability of commercial, sealed-off, "disposable" excilamps would allow operation of the present invention without the use of the expensive gas-handling equipment required for halide gases. For example, using coaxial tubular excimer lamps, similar to the D.C. glow discharge lamps demonstrated by V. Tarasenko, et al, in "Coaxial, cylindrical and planar UV excilamps, pumped by glow or barrier discharge", Excimer Lasers, Optics, and Applications, SPIE proceedings 1997, several excilamp sources may be operated in parallel, as is illustrated in FIG. 9, where the lamp discharge (13) is embodied by the four tubular excilamps positioned within the reflective cavity.

Figure 10:
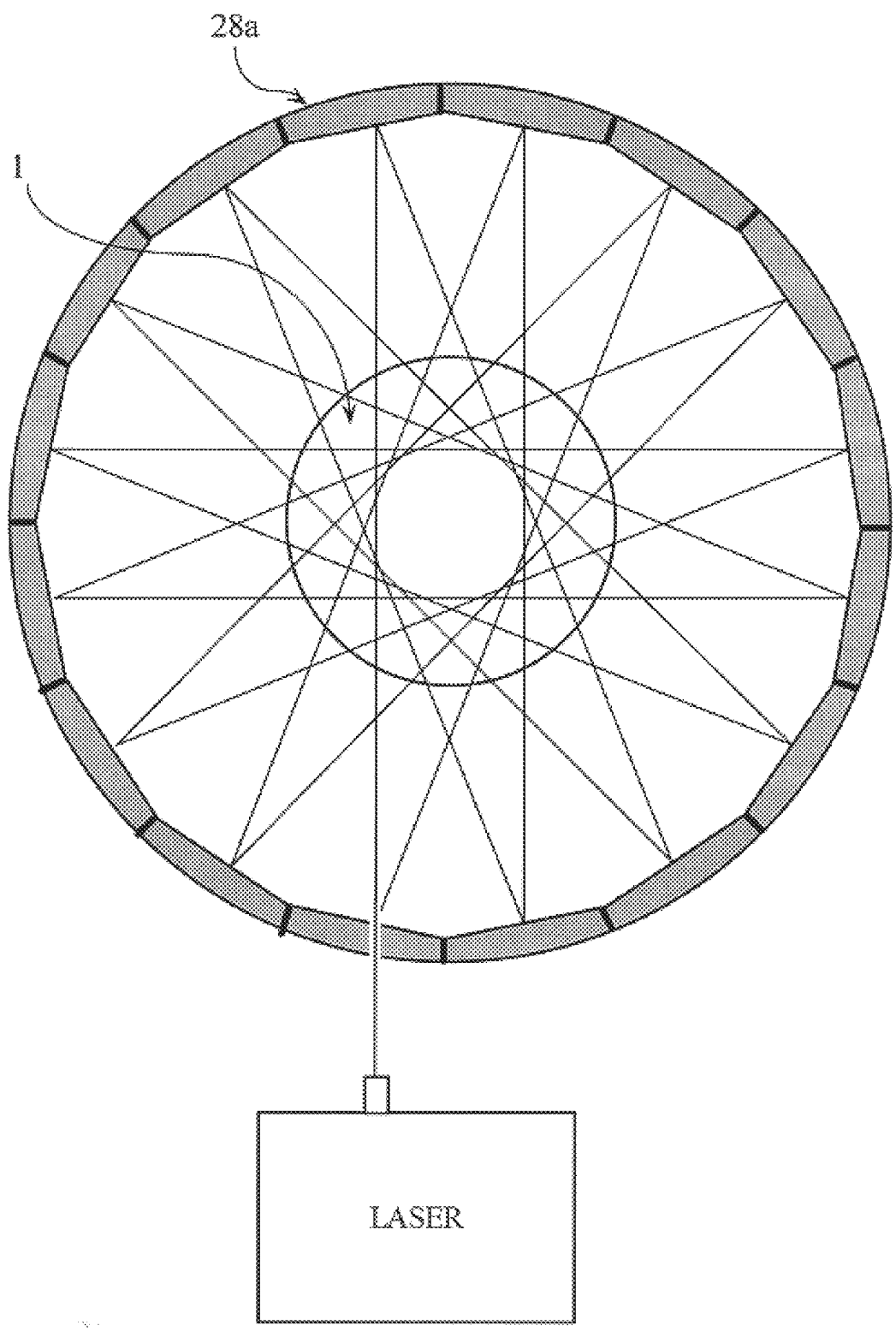

While the vapor deposition apparatus described herein is proposed, in its preferred embodiment, to utilize continuous optical elements and a continuous lamp discharge, it can also be similarly demonstrated with segmented optical elements, and/or with segmented lamp discharges. Rather than using a continuous circular window, one might utilize several windows above the periphery of the sputtering target, arranged in a circular or polygonal geometry to achieve a similar cavity effect. The same variation could be utilized in the design of either the reflector surfaces or lamp discharge, as well, with the same result of an effective UV producing cavity; and this same cavity producing an effectively delimited planar volume of UV radiation over the vapor deposition source. The UV source might also comprise a coherent UV source, such as an excimer laser. This variation is represented in FIG. 10. As can be seen in this schematic, the segmented reflector (28a), allows the uniform concentration of UV energy within a concentric volume above a circular sputter electrode (1). While the degree of rotational symmetry can be varied with the number of beam paths over the electrode, the desired result is that obtained by uniform irradiation of a symmetric volume about the sputtering plasma's major axis of symmetry.

One intended application, utilizing the apparatus and method disclosed herein, is the sputter epitaxy of AlN, GaN, InN, and the ternary and binary combinations of the same. With a high quality fused silica window, greater than 90% transmission is possible for ultraviolet radiation of wavelengths above about 190 nm. This is adequate for photoionization of Al, Ga, and In, all of which have ionization potentials of about 6 eV, or about 210 nm. Using the prominent discharge emission of the ArF* (B-X) band at 193 nm, it is possible to generate and store hundreds of watts of UV power within the reflective cavity. As the wavelengths of these UV emissions will be centered near the peak absorption cross sections for photo-ionization of aluminum, gallium, and indium vapors, the ionization rate of these plasma constituents will be significantly increased. The use of high purity nitrogen, $NH_3$, or suitable nitrogen-containing molecule, as the sputtering gas would allow the deposition of these nitrides with well controlled excitation of the deposited species, with no contamination due to the sputtering gas. In the device as fabricated, the magnetron sputter electrode is constructed using an electromagnetically variable magnetic field. By altering the magnetic field, various degrees of "unbalanced" magnetron behavior may be obtained) this will, in turn, vary the degree of bombardment of the workpiece (40) by ions and electrons. Nitrogen admitted at the workpiece will then have a tendency for being ionized by the bombarding electrons, depending on the chosen variation in the magnetron's magnetic field. In this way, one is capable of enhancing, and controlling the degree of, the kinetic energy of the Ga and N atoms arriving at the workpiece, the excitation state or ionization of the Ga atoms, and the ionization of the N atoms. All of these mechanisms are capable of adding significant amounts of non-equilibrium energy to the growth front of the crystalline thin film. In conventional sputtering of metals, the kinetic energy of the depositing species dominates; dense films are acquired at the expense of creating extensive sub-surface damage, as is described in the well-known Movchan-Demchishin-Thornton model of physical sputtering. The resultant film growth regimes of metal target reactive sputtering have been found far less predictable, and are far less understood. For instance, by ensuring a high proportion of monoatomic, activated species are available at the workpiece, more of the energy deposited at the growth interface will be available for increasing adatom mobility; rather than that being dissipated in the recoil of impinging, high velocity neutrals, most of this latter inertial energy being expended in the creation of various structural defects, as well as in the heating of the underlying film. By exercising this high degree of control over interactions at the growth interface, films possessing relatively high degrees of crystalline perfection may be achieved.

The invention disclosed herein possesses additional utility in the deposition of nitrides of Ga, Al, and In, as well as other compounds, when a multi-component target is used (such as combinations of Ga In, and Al). As the ionization potentials of Ga, In, and Al, all correspond to UV wavelengths of about 210 nm to 211 nm, a strong emission peak of the lamp discharge could be made to preferentially resonate with or exceed these respective energies; this could be achieved via the various spectral line shifting and broadening mechanisms, with pressure broadening and other collision-related mechanisms providing the greater magnitude shifts, and probably the more useful of the techniques. Alternatively, by operating several lamps in parallel, emission lines of more than one discharge gas composition could be utilized simultaneously, or in alternation, to preferentially ionize various constituents of the plasma. In this way, the "preferential sputtering", which normally plagues experiments which do not involve proper pre-sputtering of the target, could be utilized to create an alternating film structure; this, via a multi-component sputtering target which is never allowed to reach a dynamic equilibrium in its sputter yield. In a similar way, the more permanent issue of preferential sputtering at the workpiece may be manipulated for a beneficial result. The lamp discharge emission may, in this way, be switched between the resonant ionization energies, or other resonance absorption lines, of specific components in the target. This will effect not only the relative degree and nature of excitation for the different species arriving at the workpiece, but their relative arrival rate, thermal energies, and sticking coefficients, as well. In this way, modulation of the lamp discharge can result in modulation of the resultant film composition and microstructure. Dopant levels, and the nature of dopant incorporation in the film lattice, can be modulated in the same manner. The lamp discharge may also be pulsed in phase with the desired modulation in the resultant film; or at faster rates to produce a desired material phase or orientation in the resultant film.

The utility of this invention as concerns the previously mentioned nitrides will also apply towards many oxides, as well. The deposition of epitaxial $CeO_2$ on single crystal silicon has many potential applications, due to the very small lattice mismatch (<0.1%). With an ionization potential of around 5.4 eV (230 nm), cerium vapor will be efficiently ionized by the KrCl* (B-X) transition at ~222 nm. By operating the Ce sputter source in a metallic mode, wherein the target remains essentially metallic, and Ce metal ions arrive at the workpiece. The ability then exists to control the kinetic energy of these ions through bias sputtering, as well as to enhance the reactivity of the cerium at the workpiece. An added utility of the present invention in the formation of metal oxide films, is that at UV vacuum wavelengths in the area of 180 nm, still transmitted well by high quality fused silica, diatomic $O_2$ is converted into ozone, $O_3$. This transition greatly increases the chemical activity of oxygen, and with the UV power available, $O_3$ could be produced in sufficient quantities to significantly alter the growth process. The chemically active ozone and monatomic oxygen serve well in the reactive sputtering of compounds which tend to deposit in a reduced form, such as indium-tin oxide; also, the possibility exists to operate a source in a glow-discharge-cleaning mode, whereby the source is operated below the sputtering threshold, in a high oxygen content ambient (>100 mTorr), and the activated oxygen is used to alter or clean the workpiece prior to deposition.

Another clear advantage in the proficient ionization of a sputtered metal exists in the deposition of via-filling metal electrode layers in chip manufacturing. The ionization potential of Cu, at 7.726 eV (~164 nm), requires use of a single crystal window material, such as $MgF_2$ or CaF, for efficient transmission. This is most economically accomplished by fabricating the annular window as a segmented, polygonal, array. Using $F_2$ in the discharge gas, typically in a He background, the $F_2$*(D-A) transition at ~157 nm will provide an increase in metal ion in the present invention.

Used in conjunction with optical emission spectroscopy, the lamp discharge could be used as a probe to produce and/or reveal various absorption and emission lines within the plasma. This information may then be used to determine various plasma properties, ionization states, excitation states, electron densities, electron temperatures, ion densities, preferential sputtering, gas-target reaction products and rates, degree of target poisoning by the reactive gas, emitted flux, and the presence of contaminants.

Used with, for example, a spectrograph with CCD data acquisition, transient events could be responded to with real-time process control. Pulsing the lamp discharge would further allow identification of emission and absorption lines in a spatially resolved sputtering plasma. Once resultant film structure and composition are determined as a function of the partial pressures and powers for the lamp discharge and sputtering plasma, the spectroscopic information would allow real-time process control of these input parameters to achieve specific uniformity or modulation in the film structure or composition. In the same manner, the capacity for the present invention to probe a circular magnetron plasma with both high radial resolution and circular symmetry will allow for the study and manipulation of particulate formation, charging, and fragmentation in "dusty plasmas".

It is not intended that the UV lamp source, disclosed herein, be limited to use in sputter vapor deposition. For example, between the luminous flux achievable in the lamp discharge, the unique focal point or focal axis due to dichroic filtering, and the high effective numerical aperture of the cavity, power densities adequate for effecting photon-assisted ablation processes could be achieved.

Although the present invention has been described in detail with reference to the embodiments shown in the drawings, it is not intended that the invention be restricted to such embodiments. It will be apparent to one practiced in the art that various departures from the foregoing description and drawings may be made without departure from the scope or spirit of the invention.

What is claimed is:

1. An apparatus for sputter deposition onto a workpiece, comprising:
   a. an electrode for sustaining a sputtering discharge for creating a flux of sputtered vapor toward the workpiece;
   b. a source of optical radiation; and,
   c. means for directing the radiation so that the radiation propagates substantially transversely through the flux along substantially predetermined optical paths which include a multiplicity of passes through the vapor, thereby increasing photoabsorption of said radiation within the vapor.

2. The apparatus of claim 1, wherein the source of optical radiation comprises one or more excilamps.

3. The apparatus of claim 1, wherein the source of optical radiation comprises a laser.

4. The apparatus of claim 1, wherein the source of optical radiation comprises an electron beam discharge.

5. The apparatus of claim 1, wherein the source of optical radiation comprises a variable photoemitting medium.

6. The apparatus of claim 1, wherein ultraviolet radiation of multiple frequencies or a band of frequencies is used.

7. An apparatus for depositing material onto a workpiece, comprising:
   a. a chamber structure defining a vacuum chamber for containing vapor constituents;
   b. means for positioning the workpiece in the vacuum chamber;
   c. means for positioning a target in the vacuum chamber, the target comprising a source of the material, so that the material comprises at least part of the vapor constituents when the target is sputtered by particles;
   d. an optical cavity structure defining a cavity containing a process space, the process space within and in fluid communication with the vacuum chamber; and, e. a source of optical radiation for providing optical radiation within the optical cavity, the optical radiation for photoionizing the vapor constituents in the process space.

8. The apparatus of claim 7, wherein the source of optical radiation comprises one or more excilamps.

9. The apparatus of claim 7, wherein the source of optical radiation comprises a laser.

10. The apparatus of claim 7, wherein the source of optical radiation comprises an electron beam discharge.

11. The apparatus of claim 7, wherein the source of optical radiation comprises a variable photoemitting medium.

12. The apparatus of claim 7, further comprising means for metering a gas to the vacuum chamber for chemical sputtering.

13. The apparatus of claim 7, further comprising means for electrically biasing a surface within the vacuum chamber to control a momentum of ionized vapor constituents contained therein.

14. The apparatus of claim 7, wherein ultraviolet radiation of multiple frequencies or a band of frequencies is used.

15. The apparatus of claim 7, wherein the material reacts with a gas to form a compound at the workpiece.

16. An apparatus for sputtering a material surface with a plasma, comprising:

a. a chamber structure defining a vacuum chamber for containing vapor constituents;

b. gas injection means for providing process gases to the plasma;

c. an electrode positioned in the vacuum chamber for providing electrical energy to the plasma when the electrode is powered by a power source, said electrode comprising the material surface;

d. an optical cavity structure defining a cavity containing a process space, the process space within and in fluid communication with the vacuum chamber;

and, e. a source of optical radiation for providing optical radiation within the optical cavity, the optical radiation for photoionizing the vapor constituents in the process space.

\* \* \* \* \*